US012771380B2

(12) United States Patent
Twitchell, Jr.

(10) Patent No.: US 12,771,380 B2
(45) Date of Patent: *Oct. 20, 2026

(54) OBFUSCATING DATA IN DISTRIBUTED DATA STORAGE SYSTEMS AND NETWORK COMMUNICATIONS

(71) Applicant: CODE-X DELAWARE, INC., Chantilly, VA (US)

(72) Inventor: Robert W. Twitchell, Jr., St. Pete Beach, FL (US)

(73) Assignee: CODE-X DELAWARE, INC., Chantilly, VA (US)

( * ) Notice: Subject to any disclaimer, the term of this patent is extended or adjusted under 35 U.S.C. 154(b) by 83 days.

This patent is subject to a terminal disclaimer.

(21) Appl. No.: 19/007,273

(22) Filed: Dec. 31, 2024

(65) Prior Publication Data

US 2025/0175196 A1 May 29, 2025

Related U.S. Application Data

(63) Continuation of application No. 18/441,267, filed on Feb. 14, 2024, now Pat. No. 12,206,434, which is a continuation of application No. 18/092,897, filed on Jan. 3, 2023, now Pat. No. 11,949,431, which is a continuation-in-part of application No. 18/091,275, filed on Dec. 29, 2022, now Pat. No. 11,924,095.

(51) Int. Cl.
*H03M 13/00* (2006.01)
*H03M 13/15* (2006.01)

(52) U.S. Cl.
CPC .................................. *H03M 13/154* (2013.01)

(58) Field of Classification Search
CPC ........ G06F 11/10; G06F 11/00; H03M 13/00; H03M 13/37; H03M 13/25; H03M 13/154; H03M 13/13
See application file for complete search history.

(56) References Cited

U.S. PATENT DOCUMENTS

| | | | | |
|---|---|---|---|---|
| 8,171,369 B2 * | 5/2012 | Lee | H03M 13/6538 714/755 |
| 10,133,640 B2 * | 11/2018 | Shiozawa | G06F 11/1435 |
| 10,229,003 B2 * | 3/2019 | Li | H03M 13/154 |
| 11,074,129 B2 * | 7/2021 | Horn | G06F 11/1076 |
| 11,804,854 B1 * | 10/2023 | Dunning | H03M 13/1515 |

* cited by examiner

*Primary Examiner* — Esaw T Abraham
(74) *Attorney, Agent, or Firm* — TILLMAN WRIGHT, PLLC; Chad D. Tillman

(57) ABSTRACT

Storing and accessing information in a distributed data storage system includes: using erasure code, encoding a data block of the information to generate an encoded data block comprising both parity data and the data block, wherein by using the erasure code the data block may be reconstituted from a subset of the encoded data block, the subset comprising less than all of the data block; distributing, for storage, portions of the subset across a plurality of network storage locations such that the subset is not stored in its entirety at any one of the plurality of network storage locations; retrieving the distributed portions from the plurality of network storage locations; reconstituting the subset from the distributed portions that are retrieved; and using the erasure code, reconstituting the data block from the reconstituted subset of the encoded data block.

20 Claims, 28 Drawing Sheets

9003

First device encodes each data block into an encoded data block using an erasure code.

9005

First device communicates the portions of the subset of the encoded data block to storage servers, each at a different storage location in the system.

9005

First device communicates the portions of the subset of the encoded data block to storage servers, each at a different storage location in the system.

9005

First device communicates the portions of the subset of the encoded data block to storage servers, each at a different storage location in the system.

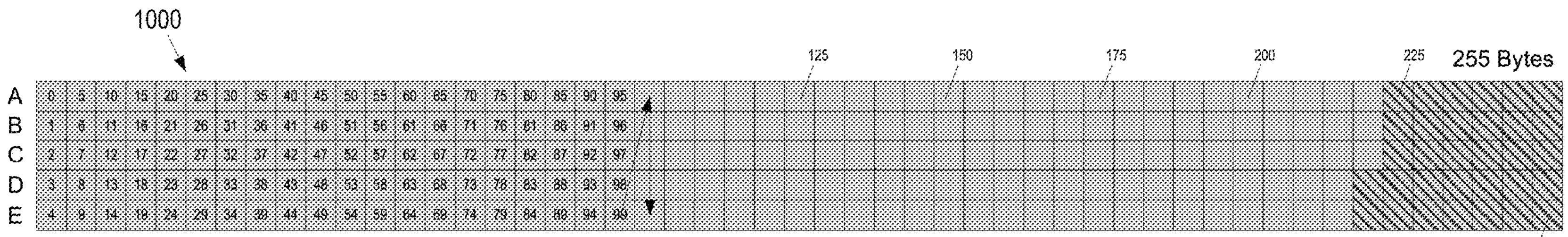
FIG. 22
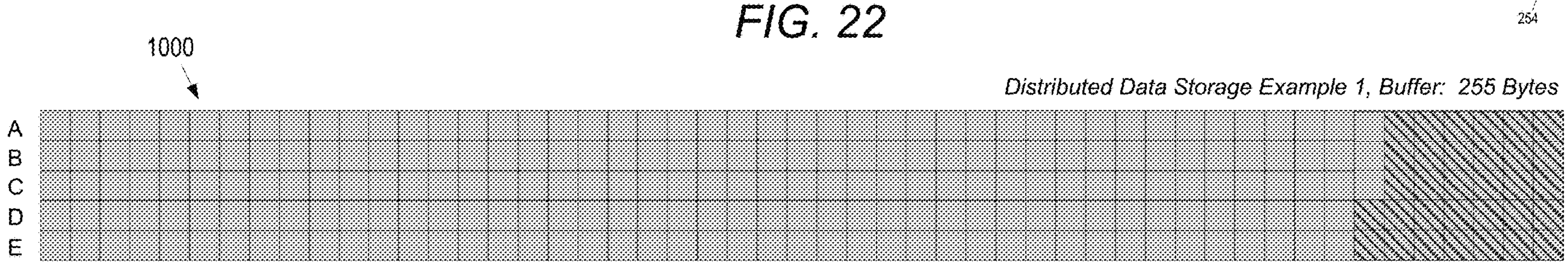
FIG. 23
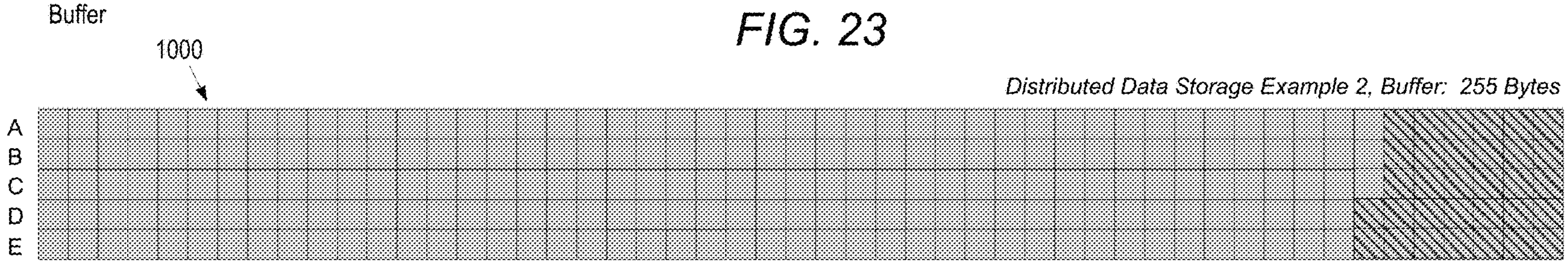
FIG. 24
| Portion | Storage Location | Example 1: Size | Example 1: Symbol Omissions | Example 2: Size | Example 2: Symbol Omissions |
|---|---|---|---|---|---|
| Row A | 199.59.214.20 | 0 Bytes | none | 0 Bytes | none |
| Row B | 130.207.218.17 | 0 Bytes | none | 0 Bytes | none |
| Row C | 192.195.66.23 | 0 Bytes | none | 0 Bytes | none |
| Row D | 63.110.91.35 | 0 Bytes | none | 0 Bytes | none |
| Row E | 73.14.194.136 | 0 Bytes | none | 0 Bytes | none |
FIG. 25

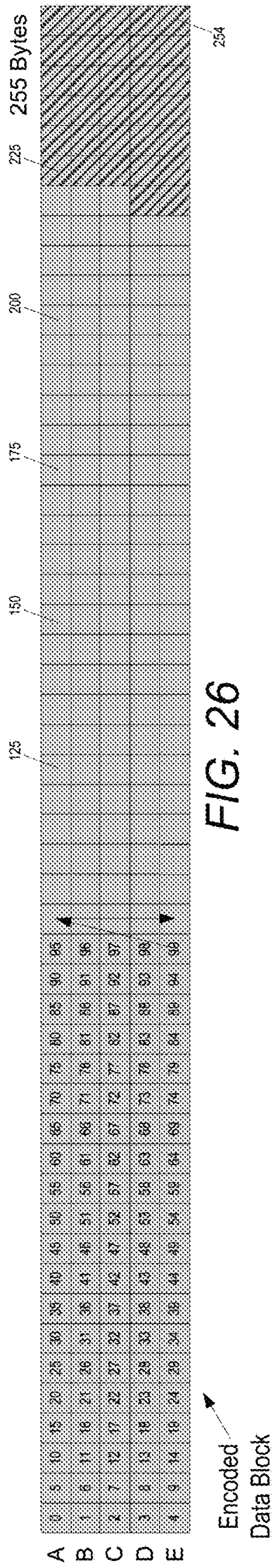
FIG. 26
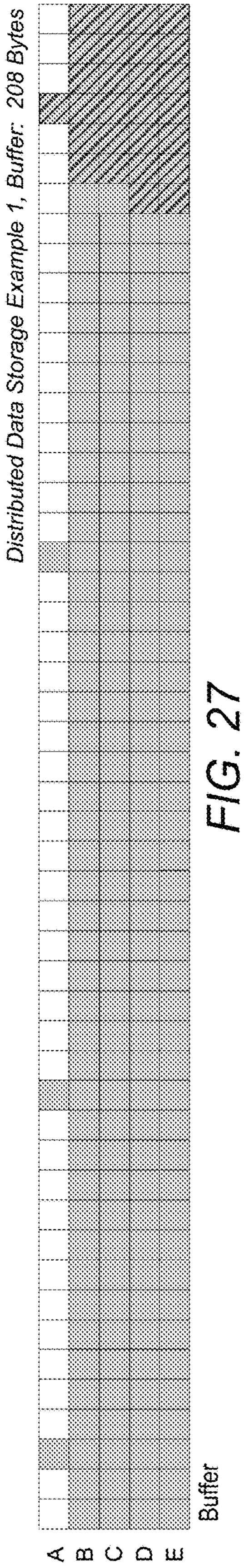
FIG. 27
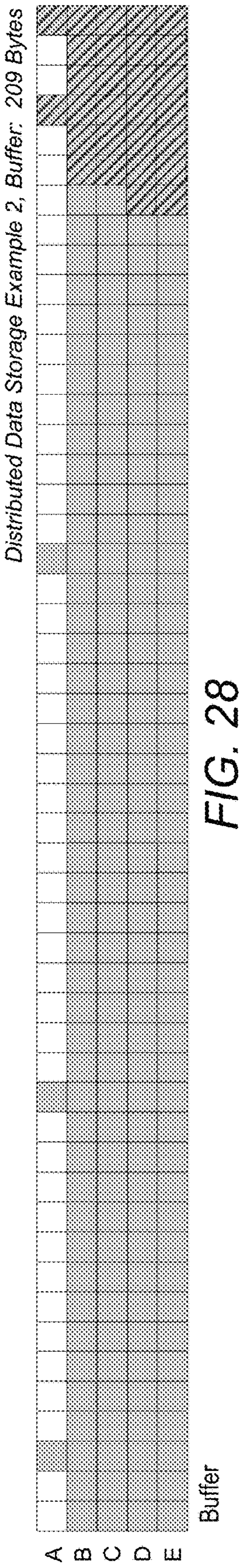
FIG. 28
| Portion | Storage Location | Example 1: Size | Example 1: Symbol Omissions | Example 2: Size | Example 2: Symbol Omissions |
|---|---|---|---|---|---|
| Row A | 199.59.214.20 | 47 Bytes | B10\|B70\|B160\|B235 | 46 Bytes | B10\|B70\|B160\|B235\|B250 |
| Row B | 130.207.218.17 | 0 Bytes | none | 0 Bytes | none |
| Row C | 192.195.66.23 | 0 Bytes | none | 0 Bytes | none |
| Row D | 63.110.91.35 | 0 Bytes | none | 0 Bytes | none |
| Row E | 73.14.194.136 | 0 Bytes | none | 0 Bytes | none |
FIG. 29

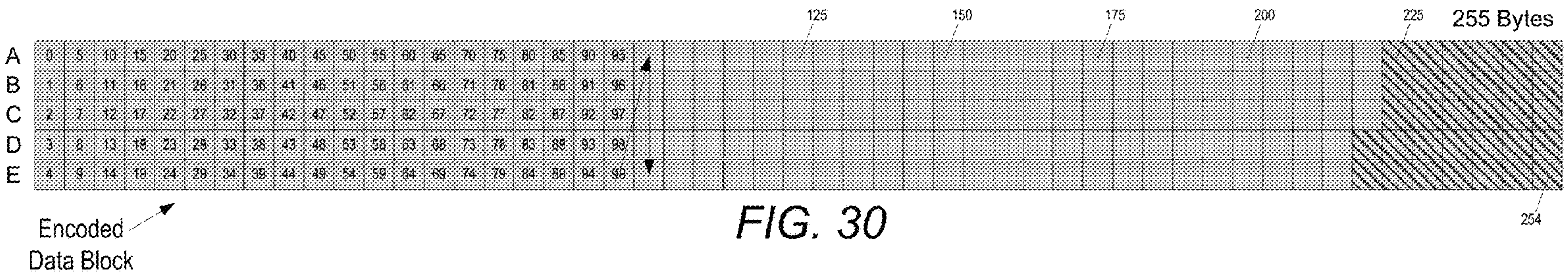
FIG. 30
Distributed Data Storage Example 1, Buffer: 161 Bytes
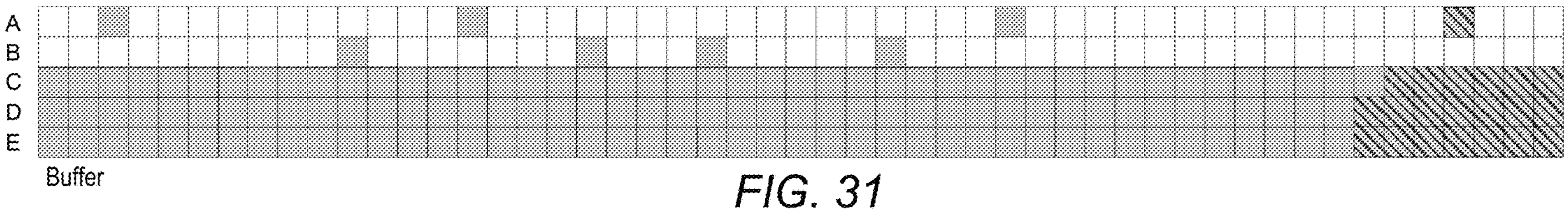
FIG. 31
Distributed Data Storage Example 2, Buffer: 164 Bytes
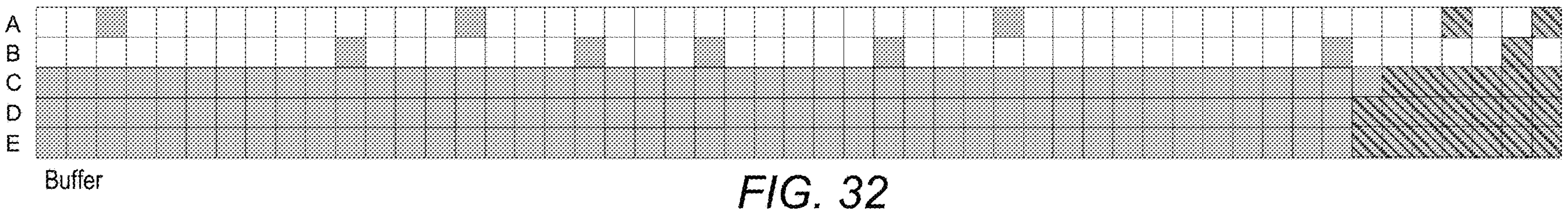
FIG. 32
| Portion | Storage Location | Example 1: Size | Example 1: Symbol Omissions | Example 2: Size | Example 2: Symbol Omissions |
|---|---|---|---|---|---|
| Row A | 199.59.214.20 | 47 Bytes | B10\|B70\|B160\|B235 | 46 Bytes | B10\|B70\|B160\|B235\|B250 |
| Row B | 130.207.218.17 | 47 Bytes | B51\|B91\|B111\|B141 | 45 Bytes | B51\|B91\|B111\|B141\|B216\|B246 |
| Row C | 192.195.66.23 | 0 Bytes | none | 0 Bytes | none |
| Row D | 63.110.91.35 | 0 Bytes | none | 0 Bytes | none |
| Row E | 73.14.194.136 | 0 Bytes | none | 0 Bytes | none |
FIG. 33

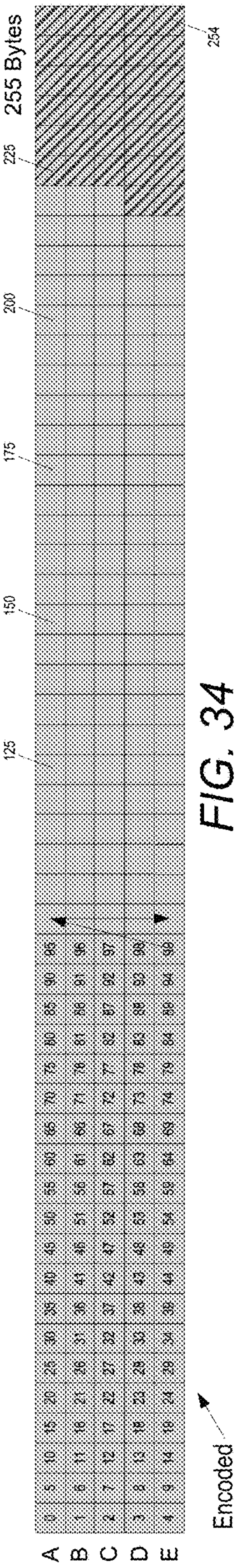

FIG. 34

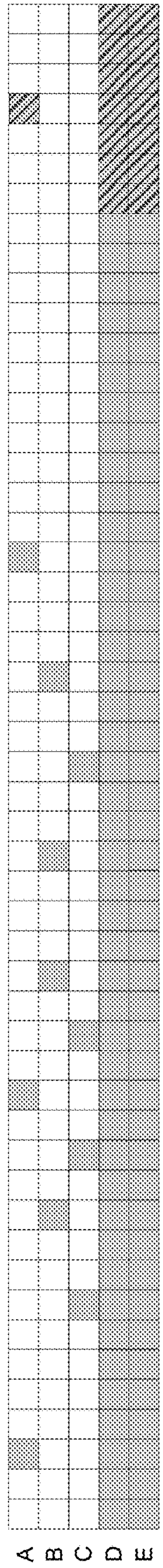

FIG. 35

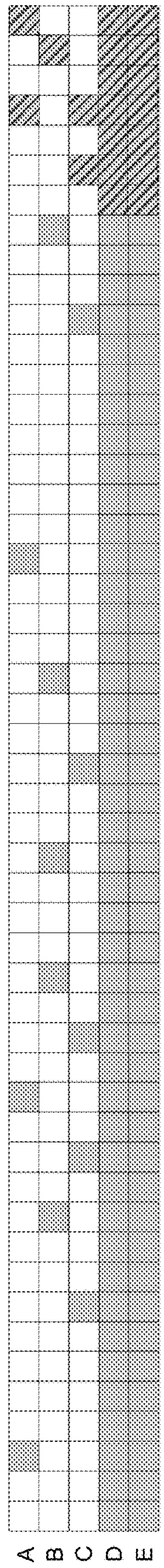

FIG. 36

<table>
<tr><th>Portion</th><th>Storage Location</th><th>Example 1: Size</th><th>Example 1: Symbol Omissions</th><th>Example 2: Size</th><th>Example 2: Symbol Omissions</th></tr>
<tr><td>Row A</td><td>199.59.214.20</td><td>47 Bytes</td><td>B10|B70|B160|B235</td><td>46 Bytes</td><td>B10|B70|B160|B235|B250</td></tr>
<tr><td>Row B</td><td>130.207.218.17</td><td>47 Bytes</td><td>B51|B91|B111|B141</td><td>45 Bytes</td><td>B51|B91|B111|B141|B216|B246</td></tr>
<tr><td>Row C</td><td>192.195.66.23</td><td>47 Bytes</td><td>B37|B62|B82|B127</td><td>44 Bytes</td><td>B37|B62|B82|B127|B203|B227|B237</td></tr>
<tr><td>Row D</td><td>63.110.91.35</td><td>0 Bytes</td><td>none</td><td>0 Bytes</td><td>none</td></tr>
<tr><td>Row E</td><td>73.14.194.136</td><td>0 Bytes</td><td>none</td><td>0 Bytes</td><td>none</td></tr>
</table>

FIG. 37

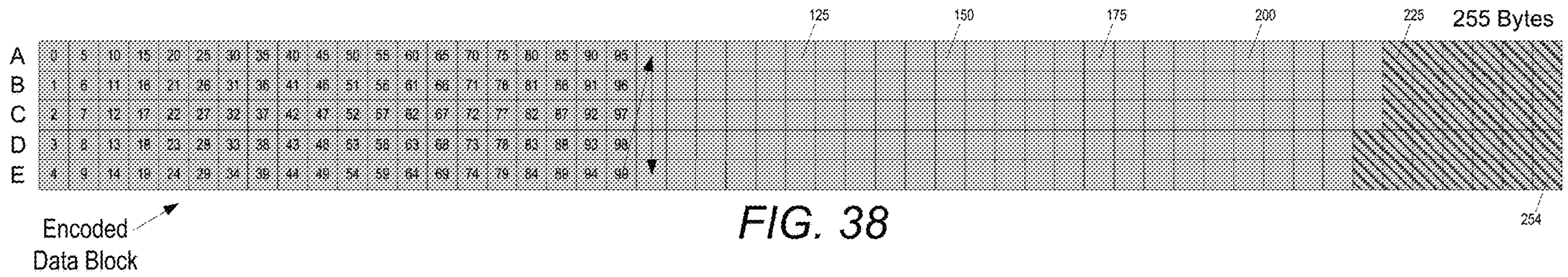
FIG. 38
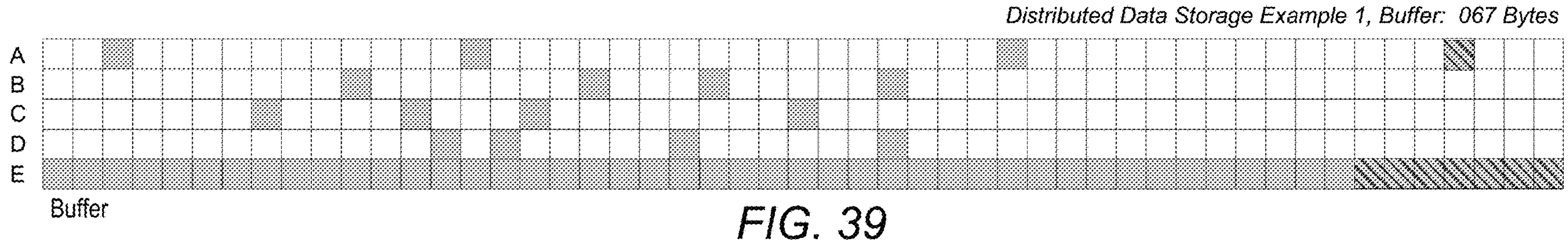
FIG. 39
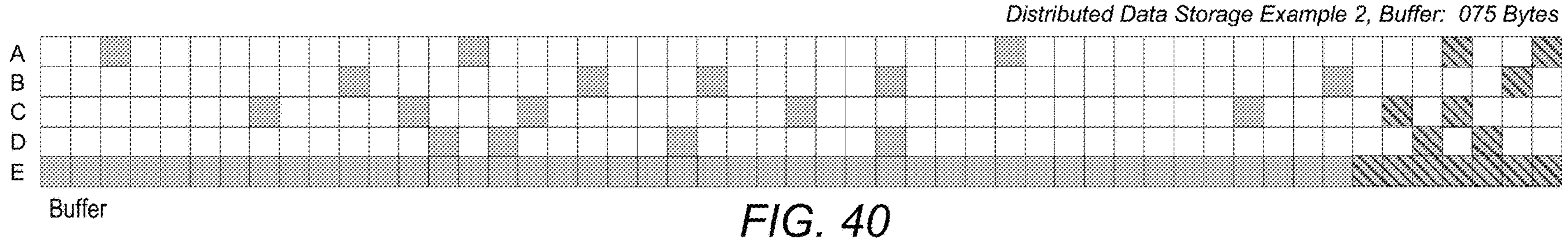
FIG. 40
| Portion | Storage Location | Example 1: Size | Example 1: Symbol Omissions | Example 2: Size | Example 2: Symbol Omissions |
|---|---|---|---|---|---|
| Row A | 199.59.214.20 | 47 Bytes | B10\|B70\|B160\|B235 | 46 Bytes | B10\|B70\|B160\|B235\|B250 |
| Row B | 130.207.218.17 | 47 Bytes | B51\|B91\|B111\|B141 | 45 Bytes | B51\|B91\|B111\|B141\|B216\|B246 |
| Row C | 192.195.66.23 | 47 Bytes | B37\|B62\|B82\|B127 | 44 Bytes | B37\|B62\|B82\|B127\|B203\|B227\|B237 |
| Row D | 63.110.91.35 | 47 Bytes | B68\|B78\|B108\|B143 | 45 Bytes | B68\|B78\|B108\|B143\|B233\|B243 |
| Row E | 73.14.194.136 | 0 Bytes | none | 0 Bytes | none |
FIG. 41

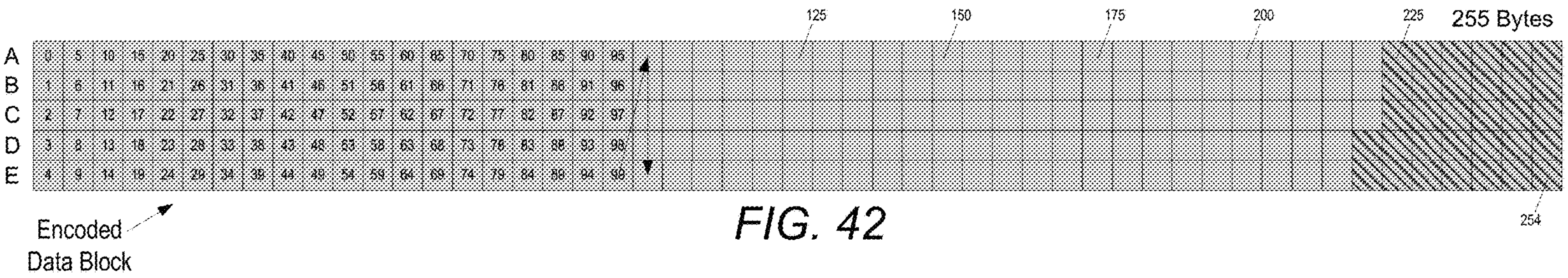
FIG. 42
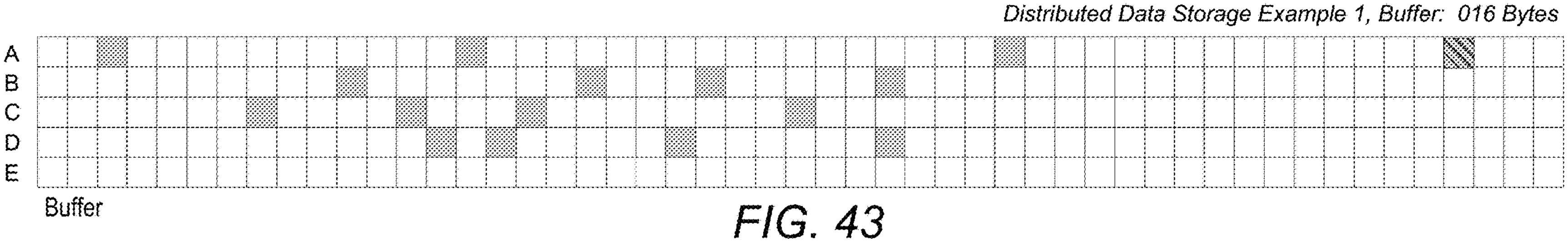
FIG. 43
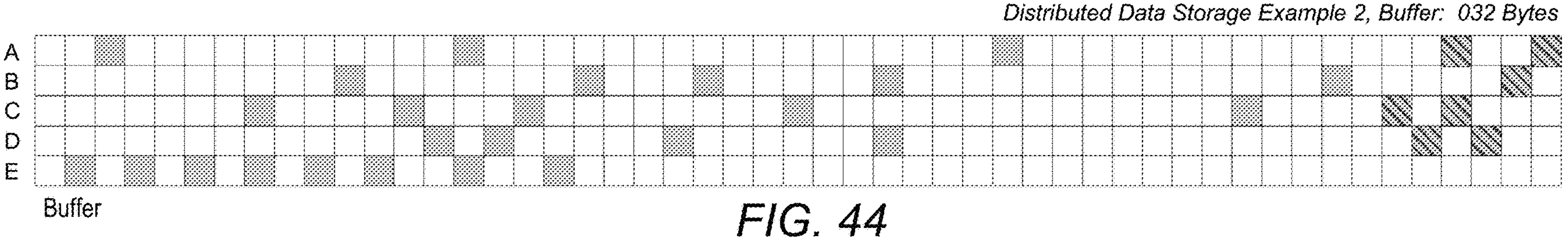
FIG. 44
| Portion | Storage Location | Example 1: Size | Example 1: Symbol Omissions | Example 2: Size | Example 2: Symbol Omissions |
|---|---|---|---|---|---|
| Row A | 199.59.214.20 | 47 Bytes | B10\|B70\|B160\|B235 | 46 Bytes | B10\|B70\|B160\|B235\|B250 |
| Row B | 130.207.218.17 | 47 Bytes | B51\|B91\|B111\|B141 | 45 Bytes | B51\|B91\|B111\|B141\|B216\|B246 |
| Row C | 192.195.66.23 | 47 Bytes | B37\|B62\|B82\|B127 | 44 Bytes | B37\|B62\|B82\|B127\|B203\|B227\|B237 |
| Row D | 63.110.91.35 | 47 Bytes | B68\|B78\|B108\|B143 | 45 Bytes | B68\|B78\|B108\|B143\|B233\|B243 |
| Row E | 73.14.194.136 | 51 Bytes | none | 43 Bytes | B14\|B24\|B34\|B44\|B54\|B64\|B79\|B94 |
FIG. 45

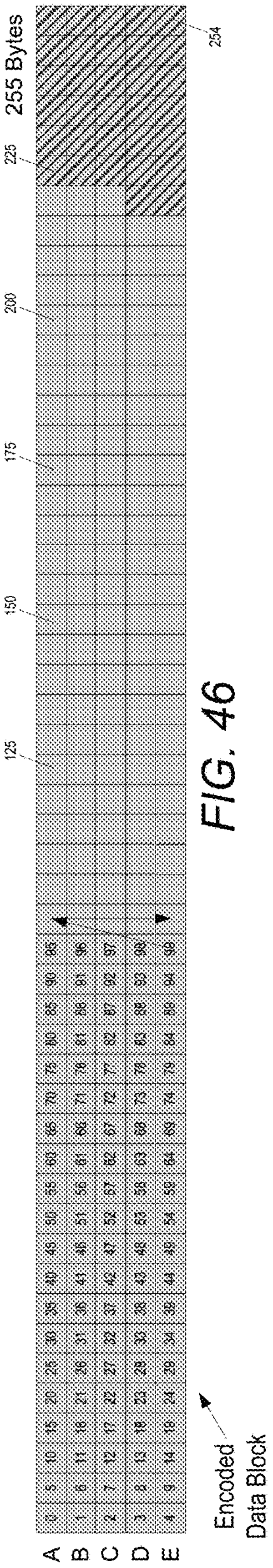
FIG. 46
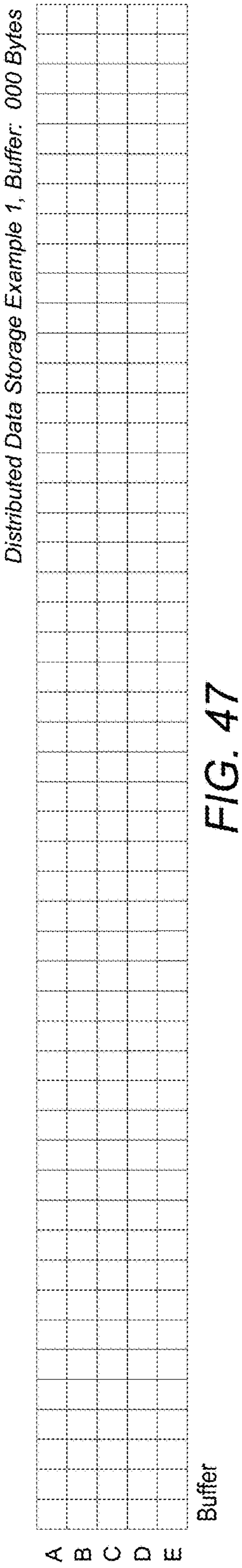
FIG. 47
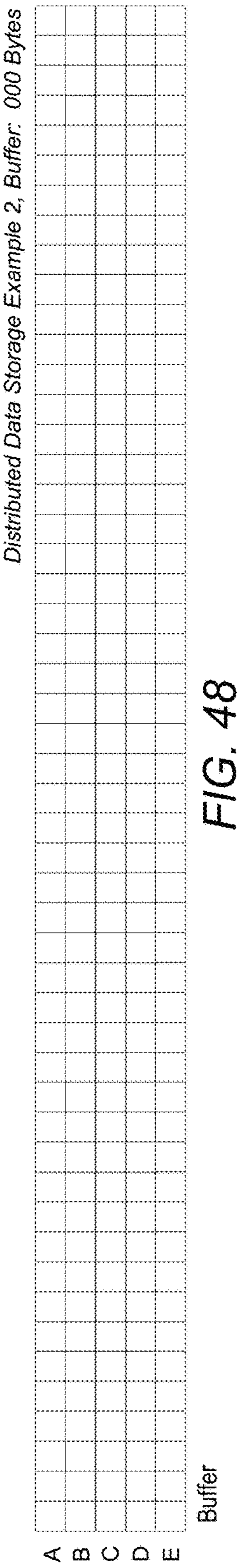
FIG. 48
| Portion | Storage Location | Example 1: Size | Example 1: Symbol Omissions | Example 2: Size | Example 2: Symbol Omissions |
|---|---|---|---|---|---|
| Row A | 199.59.214.20 | 47 Bytes | B10\|B70\|B160\|B235 | 46 Bytes | B10\|B70\|B160\|B235\|B250 |
| Row B | 130.207.218.17 | 47 Bytes | B51\|B91\|B111\|B141 | 45 Bytes | B51\|B91\|B111\|B141\|B216\|B246 |
| Row C | 192.195.66.23 | 47 Bytes | B37\|B62\|B82\|B127 | 44 Bytes | B37\|B62\|B82\|B127\|B203\|B227\|B237 |
| Row D | 63.110.91.35 | 47 Bytes | B68\|B78\|B108\|B143 | 45 Bytes | B68\|B78\|B108\|B143\|B233\|B243 |
| Row E | 73.14.194.136 | 51 Bytes | none | 43 Bytes | B14\|B24\|B34\|B44\|B54\|B64\|B79\|B94 |
FIG. 49

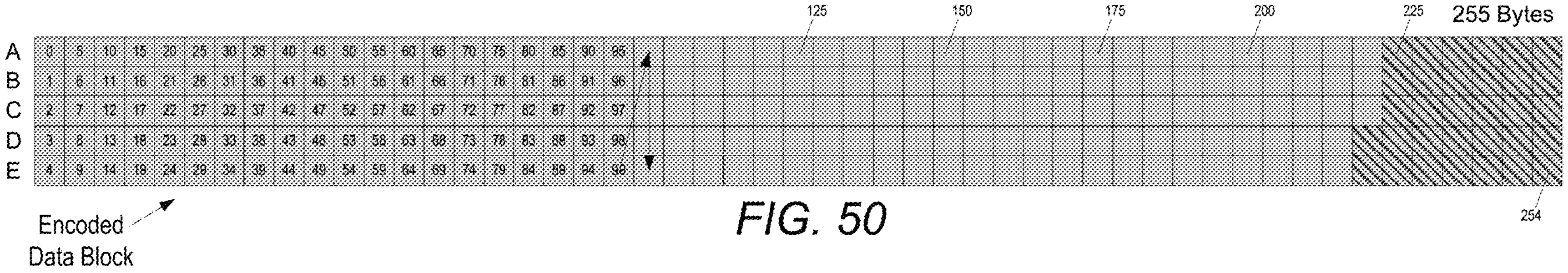
FIG. 50
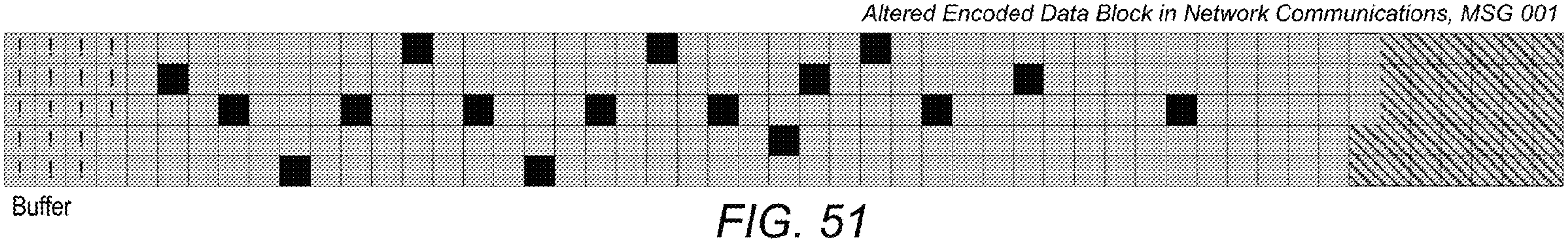
FIG. 51
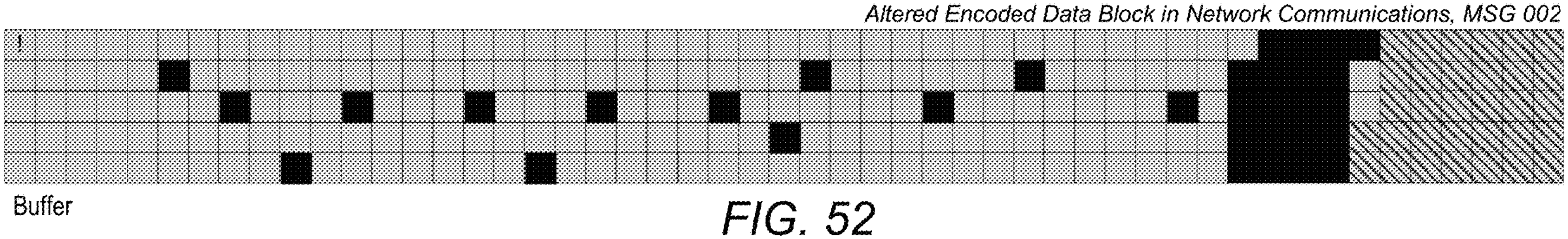
FIG. 52
| MSG | IP ADDRESS | Omissions [Alterations] |
|---|---|---|
| 001<br>239 Bytes | 63.110.91.35 | B26\|B37\|B49\|B57\|B65\|B77\|B89\|B97\|B105\|B117\|B128\|B131\|B140\|B152\|B166\|B192 [B0 THROUGH B17, Δ] |
| 002<br>223 Bytes | 73.14.194.136 | B26\|B37\|B49\|B57\|B77\|B89\|B97\|B117\|B128\|B131\|B152\|B166\|B192, and B201 THROUGH B220 [B0Δ] |
FIG. 53

OBFUSCATING DATA IN DISTRIBUTED DATA STORAGE SYSTEMS AND NETWORK COMMUNICATIONS

This application is a continuation of and claims the benefit of U.S. patent application Ser. No. 18/441,267, filed Feb. 14, 2024, now U.S. Pat. No. 12,206,434, which is a continuation of and claims the benefit of U.S. patent application Ser. No. 18/092,897, filed Jan. 3, 2023, now U.S. Pat. No. 11,949,431, which is a continuation-in-part of and claims the benefit of U.S. patent application Ser. No. 18/091,275, filed Dec. 29, 2022, now U.S. Pat. No. 11,924,095.

COPYRIGHT STATEMENT

Any new and original work of authorship in this document is subject to copyright protection under the copyright laws of the United States and other countries. Reproduction by anyone of this document as it appears in official governmental records is permitted, but otherwise all other copyright rights whatsoever are reserved.

BACKGROUND OF THE INVENTION

The present invention generally relates to storage of data at networked devices.

Communication networks for computers and other electronic devices are increasingly ubiquitous. For example, most computer and communication devices are connected to one or more networks providing access to the conventional Internet. As a more specific example, desktop and laptop computers at homes and offices are commonly connected via Wi-Fi or ethernet to a broadband network (e.g., a fiber optic broadband network, a digital subscriber line (DSL) broadband network, or a satellite broadband network) provided by an internet service provider (ISP), which in turn provides connectivity to the Internet backbone. As another example, phones and other electronic devices are commonly connected to a cellular network (e.g., a 3G, 4G, or 5G broadband cellular network) provided by a cellular provider which in turn provides connectivity to the Internet.

A commonly used model for describing data transmission standards, processes, and protocols for communicating data over such networks is the Open Systems Interconnection (OSI) reference model. OSI is organized into seven layers of abstraction that are required to organize and send data between computers and other electronic devices The lowest layer of the OSI model is the physical layer. The physical layer is responsible for transmitting and receiving raw bit streams whether over a physical medium or wirelessly. For example, the physical layer may convert digital bits into electrical, radio, or optical signals for transmission, and convert received electrical, radio, or optical signals into digital bits.

The second layer of the OSI model is the data link layer. The data link layer is responsible for encoding, decoding, and organizing data bits before being transported between two adjacent nodes on a network. The data link layer also may detect and correct errors that occur at the physical layer. The data link layer includes a logical link control (LLC) sublayer and a media access control (MAC) sublayer. The data link layer is generally characterized as defining protocol data units in the form of frames that are communicated over a link between physical network nodes. The data link layer is generally understood to pass frames to the physical layer, which then transmits the frames as part of a raw bit stream.

The third layer of the OSI model is the network layer. The network layer is responsible for moving data in networks. Network layer protocols accomplish this by packaging data with network address information and selecting the appropriate network routes. The network layer is generally characterized as defining protocol data units in the form of packets for communication over a network. The routing information contained within a packet includes the source address of the sending host and the destination address of the receiving host. The network layer is generally understood to pass packets for communication over a network to the data link layer, which in turn encapsulates packet data in frames, and passes it on to the physical layer for transmission as part of a raw bit stream.

The fourth layer of the OSI model is the transport layer. The transport layer is generally characterized as defining protocol data units in the form of segments or datagrams for communication. The transport layer is generally responsible for dividing data for communication into smaller data parts which are then each encapsulated as a segment or datagram. The transport layer can provide for flow control and error control. The transport layer can keep track of segments that are communicated, provide for acknowledgment of received segments, and recommunicate segments for which no acknowledgment was received or for which delivery failed. The transport layer is generally understood to pass segments for communication to the network layer, which in turn encapsulates segment data in packets and passes it on to the data link layer, which then in turn encapsulates packet data in frames, and passes it on to the physical layer for transmission as part of a raw bit stream.

The fifth layer of the OSI model is the session layer. The session layer is generally characterized as establishing, managing, and terminating communication sessions between local and remote applications or services.

The sixth layer of the OSI model is the presentation layer. The presentation layer is generally characterized as translating data between different formats for software applications for which the data is communicated over the network.

The seventh and final layer of the OSI model is the application layer. The application layer is generally characterized as interfacing and interacting with the software applications of the computers or other electronic devices for which the data is communicated over the network.

While the OSI model is a widely recognized model, many communication protocols do not conform exactly to the OSI model, and data is frequently communicated using protocols that do not map cleanly to the OSI model.

Perhaps the best example of this is the Internet protocol suite, which is the most commonly used protocol suite for network communications. The Internet protocol suite makes heavy use of Internet Protocol (IP) (which can include both IPv4 and IPv6) and Transmission Control Protocol (TCP), and is accordingly sometimes referred to simply as TCP/IP. The Internet protocol suite also makes use of User Datagram Protocol (UDP). Under the OSI model, TCP generally can be understood as mapping to part of the session layer and part of the transport layer, UDP generally can be understood as mapping to the transport layer, and IP generally can be understood as mapping to the network layer.

Nonetheless, the Internet protocol suite does not map cleanly to the OSI model, and instead generally defines four or five abstraction layers. Classically, the Internet protocol suite is understood as defining an application layer, a transport layer, an internet layer, and a link layer. The internet layer is sometimes characterized as a network layer. The link layer is sometimes understood as being defined above a hardware or physical layer that is not part of the link layer, and is sometimes understood as including a hardware or physical layer. The link layer is sometimes subdivided into a data link layer and a physical layer.

With respect to the present disclosure, a conventional layer characterization schema ("Conventional Schema") used herein shall include the characterization of an application layer, a transport layer, a network layer, a data link layer, and a physical layer. In this Conventional Schema, a message for communication over a network from a software application is processed at an application layer and encapsulated in one or more segments at a transport layer, each segment being encapsulated in a packet at a network layer, each packet being encapsulated in a frame at a data link layer, and each frame being transmitted in a raw bit stream at a physical layer. Thus, for example, data is commonly communicated over the Internet utilizing TCP segments encapsulated inside of IP packets. As another example, data is commonly communicated over the Internet utilizing UDP segments or datagrams encapsulated inside of IP packets. In each case, IP packets are themselves encapsulated inside of frames (e.g., Ethernet frames) at the data link layer. Raw bit streams for such frames are communicated over the physical networks in accordance with communication protocols of the physical networks.

It will be appreciated that networks allow for communication of data from one electronic device to another, e.g., allow a user at a location to utilize an electronic device to communicate information with or access resources or services at another location. The Appendix, which is hereby incorporated herein by reference, includes drawings by which the prior art will now be described.

FIG. 1 of the Appendix illustrates an arrangement wherein a user device 20 communicates data to a server 30 over a network. Data is communicated from the user device 20 over a network segment 22 to a network core 40, is communicated through the network core 40, and is then communicated onward over a network segment 32 to the server 30. The user device 20 and sever 30 represent network nodes comprising communication endpoints in the network. The network may be a local or wide area network and may comprise the Internet.

It will be appreciated that the network segment 22 connecting the user device 20 to the network core 40 can be characterized as a "first mile segment", and that the network segment 32 connecting the server 30 to the network core 40 can be characterized as a "last mile segment" when a communication is sent from the user device 20 to the server 30. It will further be appreciated that each of the one or more network segments 22,32 may comprise a plurality of links between a plurality of physical network nodes in the form of networked devices. For example, the network segment 22 may comprise a Wi-Fi connection from the user device 20 to a wireless router, a connection from the wireless router to a cable modem, and a connection from the cable modem to the network core 40 through one or more network nodes (e.g., one or more switches or other devices of an ISP). The data is communicated from the user device 20 to the server 30 as one or more packets, which are communicated as part of one or more frames, in accordance with the above discussion.

FIG. 2 of the Appendix illustrates a specific network path from the user device 20 to the server 30 over a plurality of network segments C-D-E-F-G-H that form part of the network core 40. The specific network path C-D-E-F-G-H that is illustrated passes through, inter alia, network nodes 42,44 representing proximal endpoints of the respective network segments 22,32. It will be appreciated that although only a small number of segments are illustrated for clarity, a network path may comprise a large number of segments, and each illustrated segment itself may represent a plurality of links.

FIG. 3 of the Appendix figuratively illustrates a schema of an exemplary IP packet communicated over the network path illustrated in FIG. 2 of the Appendix. The IP packet includes an IP packet header and an IP packet payload. The IP packet payload in turn contains a TCP segment which includes a TCP header and a TCP payload. The TCP payload contains application data, which may be encapsulated with one or more other headers, such as an application header.

FIG. 4 of the Appendix illustrates a conventional schema of an IPv4 header.

FIG. 5 of the Appendix illustrates a conventional schema of a TCP header.

FIG. 6 of the Appendix illustrates a conventional schema of a UDP header.

Conventional networks, such as the Internet, rely heavily on centralized routers to perform routing tasks in accomplishing network communications, and end devices have relatively little control over a network path utilized for such network communications; however, approaches have been proposed which give end devices some level of control over network routing. For example, U.S. Pat. No. 9,071,607, which is hereby incorporated herein by reference, discloses an approach which involves intentionally routing network traffic through one or more intermediate network nodes, referred to therein as "deflecting" communications through such nodes which, in turn, are called deflect nodes or simply "deflects".

FIG. 7 of the Appendix schematically illustrates in general a conventional routing of a packet from an originating device 120 at an endpoint node to a destination device 130 at an endpoint node through a plurality of intermediate network nodes. The network may be a local or wide area network and may comprise the Internet.

In accordance with the '607 patent, a specific network node, such as node 140 shown in FIG. 8 of the Appendix, can be used as a "deflect" by forcing a packet to be routed therethrough. For example, this can be accomplished by originating device 120 sending a packet to deflect node 140, as illustrated in FIG. 8 of the Appendix, with node 140 receiving and then sending the packet along to the destination device 130, as illustrated in FIG. 9 of the Appendix. In this way, the node 140 acts as a data deflect node limiting the possible paths a packet may take through the network to a path that must include node 140, such as the particular path illustrated in FIG. 10 of the Appendix.

As the '607 patent discloses, although complete control of routing with respect to nodes may not be available, by choosing to utilize one or more deflects, distinct multiple paths can be chosen and utilized. The ability to choose and utilize deflects thus enables different messages to be sent over different network paths, or different parts of a message to be sent all at once over different network paths. This ability also enables a network path to be changed over time or in response to a failed connection. The '607 patent further discloses the use of a "control server" to establish, monitor, and control connections, or communication channels between, endpoint nodes over networks. In accordance with the '607 patent disclosure, client software installed at devices forming endpoint nodes communicate their internet protocol (IP) addresses to a control server, which stores those IP addresses in association with unique identifiers representing the devices and/or users of the devices. The client software at the device of an endpoint node periodically checks in with the control server to maintain up-to-date IP address information associated with its unique identifier. Then, when two devices/users are to communicate with one another, and after the control server determines that the devices/users are authorized to communicate with one another, the control server communicates connection information to the software clients at those devices which information facilitates a communication connection between those devices. Generally, the control server is not involved in this connection, and does not form part of the network path for the network communications between those devices; the control server just facilitates the connection that is established between those devices.

In addition to communicating connection information to the software clients on those devices, the control server also communicates control information to deflects. The control server and communications used to establish, monitor, and control connections, or communication channels, can be characterized as being associated with a "control plane", while data deflects and communication of data between end nodes, e.g., over established connections or communication channels, can be characterized as being associated with a "data plane". This architecture and methodology can be characterized as setting up a software-defined network in which the control plane is utilized to set up network communications over the data plane. Indeed, U.S. Pat. No. 10,833,972, which is hereby incorporated herein by reference, discloses such an approach.

The '972 patent discloses an approach in which, in addition to using deflects as data deflects which facilitate communications of data over the data plane, one or more deflects are utilized to facilitate control communications over the control plane. Such deflects can be characterized as control plane deflects. A single deflect may operate as a data deflect, a control plane deflect, or both.

For purposes of illustration, consider a situation shown in FIG. 11 of the Appendix involving a first device 120 seeking to communicate with a second device 130. Each device 120,130 represents a network end node or endpoint, and the network may be a local or wide area network and may comprise the Internet. Each device 120,130 has a unique identifier, which can be characterized as a node identifier (NID), that is associated therewith at a control server 150. The NID may represent the MAC address of a device constituting the node of the network or may represent any other unique identifier for the device. The first device 120 has a unique node identifier of "12" in this illustration, while the second device 130 has a unique node identifier of "4" in this illustration.

Devices serving as data deflect nodes also have unique identifiers in the form of node identifiers. These include data deflect node 160 having a node identifier of "100", data deflect 162 having a node identifier of "202", and data deflect 164 having a node identifier of "310".

The first device 120 communicates to the control server 150 a request to communicate with the second device 130. The control server 150 communicates, over the control plane, e.g., utilizing one or more control plane deflects schematically represented by deflect node 170 in FIG. 12 of the Appendix, connection information enabling the first device 120 to set up a connection for communications between the first device 120 and the second device 130. This may include communication of the identification of one or more data plane deflect nodes.

The first device 120 then communicates a packet comprising a control portion over a network for communication to the second device 130 via one or more intermediate nodes, including one or more data deflects. A control portion, or control portions, of a packet may comprise one or more headers of a packet or within a packet, or even one or more control portions contained in the payload of a packet.

Communications can be set up to utilize a single deflect, or multiple deflects.

In an exemplary implementation involving a single deflect, a control portion of a packet includes an indication of a destination address for the packet, and a node identifier for the ultimate destination of the packet. More generally, a control portion of a packet, such as a data packet or a control packet, can include authentication data, a messaging version, a source client node identifier, a destination client node identifier, a next hop node identifier, a source session identifier, a destination session identifier, a channel identifier, a connection identifier, a length, and command specific data (e.g., a packet number for a data packet and/or frame). The control portion may also include a route identifier, as described hereinbelow. The control portion may also include some reserved fields, flag fields, and tracing fields. A control portion may include, as it normally would, an indication of source and destination MAC addresses for layer 2, an indication of source and destination IP addresses for layer 3, and an indication of source and destination ports.

The first device 120 can, based on control information received from the control server 150 via the control plane, set the destination address of data node deflect 160, e.g., the IP address of the node 160, in the control portion of the packet and additionally set the destination node identifier for the ultimate or final destination to the node identifier of the second device 130. The packet is then communicated from the first device 120 to the deflect 160, as illustrated in FIG. 13 of the Appendix.

At the deflect 160, the packet, the control portion, or a portion thereof, may be decrypted, and the deflect accesses the final destination node identifier contained therein. The deflect 160 looks up, in a maintained table, an IP address associated with the final destination node identifier. This table may be populated based on control information received from a control server over the control plane or based on network knowledge gleaned from packets received by the deflect 160 from the second device 130, e.g., control packets representing a ping received from the second device 130 as part of setting up a connection. This table may form part of a routing table or may be utilized in conjunction with a routing table which identifies a next node to forward the packet to in order to reach the second device 130.

The deflect 160 then sets the destination IP address to the looked-up IP address associated with the second device 130 and forwards the packet onward based on its routing table. The packet is then routed onward to the second device 130, as illustrated in FIG. 14 of the Appendix.

This process involves use of a single deflect and can be characterized as a "single-hop" deflection process.

A multi-hop deflection process, which involves the use of multiple deflects, can also be utilized. In an exemplary such implementation, a route identifier is utilized to identify a route from an originating node to a destination node through multiple data deflects that are specified in the route using the unique node identifiers of the deflects.

Returning to the previous example, the control server 150 could provide, over the control plane, route information which indicates a route from the first device 120 to the second device 130 through data deflects 160,162,164, and further indicates a route identifier for said route, in this example the route indicator "0x0005" or simply "5". The route identifier may include a bit which specifies a direction for the route, e.g., "0x0005" may be a first direction, and "0x8005" may be a second, opposite direction. This route information, as well as other control information, may be communicated to the data deflects 160,162,164 from the control server 150 directly, or may be communicated via use of one or more control plane deflects. For example, FIG. 14 of the Appendix illustrates exemplary communication of control information comprising route information from the control server 150 to data deflect 160 via control plane deflect 170.

In setting up a connection from the first device 120 to the second device 130, the control server 150 provides control information to the first and second devices 120,130 which may include a route identifier, e.g., a route identifier of "0x0005" may be provided to the first device 120, and a route identifier of "0x8005" may be provided to the second device 130. This control information may be communicated to the first and second devices 120,130 from the control server 150 directly, or may be communicated via use of one or more control plane deflects.

The first device 120 can, based on control information received from the control server 150 via the control plane as shown in FIG. 15 of the Appendix, set the destination IP address in the control portion of the packet to the IP address of a deflect, such as deflect 160, set the final destination node identifier to the node identifier of the second device 130, and set the route identifier to the route identifier provided by the control server 150, e.g., "0x0005". The packet is then communicated from the first device 120 to the data deflect 160, as illustrated in FIG. 16 of the Appendix.

At the deflect 160, the packet, the control portion, or a portion thereof may be decrypted, and the deflect accesses the route identifier contained therein. The deflect 160 looks up, based on the route identifier, the node identifier for the next hop along the route, which in this case would be the node identifier of "202", as illustrated in FIG. 17 of the Appendix. This node identifier of "202" corresponds to the data deflect 162. The deflect 160 looks up, in a maintained table, an IP address associated with the next hop node identifier of "202". This table may be populated based on control information received from the control server over the control plane, or this table may be populated based on network knowledge gleaned from packets received from deflect 162, e.g., control packets representing a ping received as part of setting up a connection. This table may form part of a routing table or may be utilized in conjunction with a routing table which identifies a next node to forward the packet to in order to reach deflect 162 corresponding to the node identifier of "202" indicated to be the next hop along the route.

The deflect 160 sets the destination IP address to the looked-up IP address associated with the deflect 162 and sends the packet onward based on its routing table. The packet is then routed onward to the deflect 162, as illustrated in FIG. 18 of the Appendix.

At the deflect 162, the packet, the control portion, or a portion thereof may be decrypted, and the deflect 162 accesses the route identifier contained therein. The deflect 162 looks up, based on the route identifier, the node identifier for the next hop along the route, which in this case would be the node identifier of "310". This node identifier of "310" corresponds to the data deflect 164. The deflect 162 looks up, in a maintained table, an IP address associated with the next hop node identifier of "310". As before, this table may be populated based on control information received from the control server over the control plane, or this table may be populated based on network knowledge gleaned from packets received from deflect 164, e.g., control packets representing a ping received as part of setting up a connection. This table may form part of a routing table or may be utilized in conjunction with a routing table which identifies a next node to send the packet to in order to reach the deflect 164 corresponding to the node identifier of "310" indicated to be the next hop along the route.

The deflect 162 sets the destination IP address to the looked-up IP address associated with the deflect 164 and forwards the packet onward based on its routing table. The packet is then routed onward to the deflect 164, as illustrated in FIG. 19 of the Appendix.

At the deflect 164, the packet, the control portion, or a portion thereof may be decrypted, and the deflect 164 accesses the route identifier contained therein. The deflect 164 looks up, based on the route identifier, the node identifier for the next node along the route, which in this case would be the node identifier of "4". This node identifier of "4" corresponds to the second device 130. The deflect 164 looks up, in a maintained table, an IP address associated with the next hop node identifier of "4". This table may be populated based on control information received from the control server over the control plane, or this table may be populated based on network knowledge gleaned from packets received from the second device 130, e.g., control packets representing a ping received as part of setting up a connection. This table may form part of a routing table or may be utilized in conjunction with a routing table which identifies a next node to forward the packet to in order to reach the second device 130 corresponding to the node identifier of "4" indicated to be the end of the route defined by the route identifier.

The deflect 164 sets the destination IP address to the looked-up IP address associated with the second device 130 and forwards the packet onward based on its routing table, as shown in FIG. 20 of the Appendix.

Approaches such as these involve use of the data plane to tunnel, encapsulate, or otherwise transport user data from a first endpoint node to a second endpoint node. These endpoint nodes may be user devices such as phones, tablets, or laptop computers; may be servers connecting two or more locations or connecting a single user to a service; may be IoT devices; and may be virtual devices on a virtual machine or in a container.

Traditionally, when a packet is received at a device, it is impossible to determine the exact network path that was taken in communicating the packet through the network; however, approaches have been proposed for tracking and providing a pathway history for the path that a packet takes through a network in a communication from an origin node to a destination node. For example, each of U.S. Pat. Nos. 7,990,947; 8,625,574; 9,060,023; and 9,392,020, each of which is hereby incorporated herein by reference, discloses an approach which involves providing, as part of a communicated packet, a pathway history for the path by which the packet has been communicated from the origin node to the destination node. This may involve appending, by each of one or more respective nodes along the network path, a unique identifier of that respective node, such as an IP address, a MAC address, or a node identifier. Similarly, the '607 patent discloses an approach which involves appending, at each of one or more nodes along a path of a packet, information regarding that node or that path. Such pathway history that is created in accordance with these teachings is referred to herein as a "watermark" or "network watermark".

Approaches are known in which a network is used to interconnect one or more data storage devices to form a distributed data storage system. The system may comprise a wide area network including the Internet and may comprise an overlay network or software-defined network (SDN). Such a distributed data storage system may provide block storage, sometimes referred to as block-level storage, that is used to store data files on storage area networks (SANs) or cloud-based storage environments. Such an approach can be used to enhance storage devices such as disk arrays (e.g., a RAID array, which is a Redundant Array of Independent Disks), and optical drives and tape libraries. Such a system may be designed so that the storage looks like a local disk. Frequently, such an approach, e.g., a SAN, will have its own disks that are not accessible to other local devices.

In a conventional implementation of such an approach, cloud-based storage and processing are utilized; however, the use of such cloud-based storage and processing can present significant security and information fidelity issues. For example, data to be transferred may not transfer due to an error with a server or a storage device, or a hacker may attempt to break in through a public access point, such as a website. Further, breaches may occur when employees are careless or malicious, thereby allowing data to be copied or stolen from a database, or, perhaps worse, allowing data to be changed, or other actions taken that may cause additional harm. Further still, sometimes a storage area network may fail to transfer files because only one route is available, which can increase risk if communications are attempted multiple times. Encryption is sometimes utilized to protect data, but, given enough processing power, such encryption alone may not be enough.

Thus, storing information in a network, such as in cloud storage, is subject to theft and hacking, both where information is stored and as it is being transferred over the network, allowing hackers to potentially collect sensitive and personal information, e.g., from devices and storage facilities, or from data in motion. For example, information can be stolen by copying data out of a database, monitoring data streaming into a database, or taking data directly off an end user device. Companies should no longer rely on encryption as the only method to secure their data.

Approaches are known in which intentional "deflecting" of network traffic through one or more intermediate nodes or devices is utilized in a storage context. For example, data can be dispersed by being distributed to, and stored at, devices each at one of a plurality of different network nodes. Thus, data may be dispersed from a mobile phone and stored at a laptop, a desktop, another mobile phone, and a server. Because data may be distributed to multiple, physically separate locations or sites, hacking such data at its place of storage would thus require hackers to hack multiple different devices at multiple, different locations or sites to gather all of the data. Such division of the data into portions for storage at different locations thus provides a measure of security to the data.

Similarly, as the data is distributed utilizing virtual dispersive routing, multiple routes would have to be hacked to gather all of the data while in motion. This also provides a measure of data security.

In some implementations and methodologies, devices forming part of a distributed data storage system (DDSS) are authenticated by utilizing a fingerprint of stored data for such authentication. This may be a hash of stored data, or other fingerprint or authentication token which is derived from or based on stored data. In an exemplary such methodology, a device having data for storage in a distributed data storage system generates a hash using that data and then communicates the data for storage in a node in the distributed data storage system. The device stores the hash in association with the node at which the data is to be stored. Subsequently, when the device wants to communicate with that node, the device requests an authentication token from that storage node. The storage node, in order to authenticate, generates a hash on the stored data it previously received from the device, and then communicates the generated hash to the device as an authentication token. The device compares the received authentication token to the hash it has stored in association with the storage node in order to authenticate the storage node.

In some implementations and methodologies, when data stored in a distributed data storage system is accessed and updated by the device, this process is utilized, and the object to be used for authentication of each device in the distributed data storage system is updated as well. Date or time information and other information can be automatically included in the data to be stored as well, and the updating of such constantly changing information causes authentication objects to be updated upon accessing data in a distributed data storage system even absent any further changes to the data.

FIGS. 21, 22, and 23 of the Appendix illustrate an exemplary methodology for authentication utilizing a fingerprint of stored data. As additionally illustrated in FIG. 25 of the Appendix, at starting point 8001, a first device contains data A to be stored in a distributed data storage system. At step 8002, the first device generates a hash for data A. At step 8003, the first device splits data A into portions B and C, and D.

At step 8004, the first device determines it will send portion B to device 1, portion C to device 2, and portion D to device 3.

As illustrated in FIG. 25 of the Appendix, at step 8005, the first device generates a hash for portion B and stores the hash in association with portion B and device 1. At step 8006, the first device generates a hash for portion C and stores the hash in association with portion C and device 2. At step 8007, the first device generates a hash for portion D and stores the hash association with portion D and device 3.

As illustrated in FIG. 26 of the Appendix, at step 8008, the first device communicates portion B to device 1, at step 8009, the first device communicates portion C to device 2, and at step 8010, the first device communicates portion C to device 3.

Subsequently, at step 8011, the first device goes to retrieve data A and determines it needs to retrieve portions B, C, and D.

As illustrated in FIG. 27 of the Appendix, at step 8012, the first device requests a hash from device 1 for authentication. This may involve identifying the data to be retrieved for which the hash is sought. At step 8013, in response to the request, device 1 generates a hash for portion B and communicates the generated hash to the first device.

As illustrated in FIG. 28 of the Appendix, at step 8014, the first device authenticates device 1 by comparing the received hash to the stored hash for portion B.

As illustrated in FIG. 29 of the Appendix, at step 8015, following authentication, the first device requests portion B from device 1. At step 8016, in response to the request, device 1 sends portion B to the first device.

As illustrated in FIG. 30 of the Appendix, at step 8017, the first device generates a hash for the received portion B. At step 8018, the first device compares the newly generated hash to the stored, original hash for portion B, in order to determine whether the retrieved data is corrupted.

This process is repeated for the other portions C and D. Referring back to FIGS. 21, 22, and 23, at step 8019, the first device requests a hash from device 2 for authentication. At step 8020, in response to the request, device 2 generates a hash for portion C and communicates the generated hash to the first device. At step 8021, the first device authenticates device 2 by comparing the received hash to the stored hash for portion C. At step 8022, the first device requests portion C from device 2. At step 8023, in response to the request, device 2 sends portion C to the first device. At step 8024, the first device generates a hash for the received portion C. At step 8025, the first device compares the newly generated hash to the stored, original hash for portion C. At step 8026, the first device requests a hash from device 3 for authentication. At step 8027, in response to the request, device 3 generates a hash for portion D and communicates the generated hash to the first device.

As illustrated in FIG. 23 of the Appendix, at step 8028, the first device authenticates device 3 by comparing the received hash to the stored hash for portion D. At step 8029, the first device requests portion D from device 3. At step 8030, in response to the request, device 3 sends portion D to the first device. At step 8031, the first device generates a hash for received portion D. At step 8032, the first device compares the newly generated hash to the stored, original hash for portion D.

At step 8033, the first device combines portions B, C, and D to form data E. At step 8034, the first device generates a hash for data E. At step 8035, the first device compares the generated hash for data E to the stored hash for data A, in order to determine whether the retrieved data is corrupted.

While FIGS. 21, 22, and 23 of the Appendix have set forth these steps, which may be performed with various subcombinations regarding devices 1, 2, and 3, FIGS. 24 through 30 of the Appendix set forth schematic illustrations of a portion of these steps in this process.

Notwithstanding the aforementioned methodologies and systems, as network communications and network storage have become more and more ubiquitous, the security of network communications and network storage has become more and more important, and attempts to intercept network communications continue, especially for some networks and some types of communications. Moreover, spreading data across servers still creates problems of authentication and data integrity in at last some scenarios. Issues with network delay, congestion, loss of data, spoofing and other network problems causes poor performance in network drives that have spread data across servers especially geographically spread servers. Movement of data over networks also can be cost prohibitive.

Accordingly, needs exist for further improvement in securely communicating over networks, networking, network communications, network routing, and remote and network storage. These and other needs are addressed by one or more aspects of the present invention.

SUMMARY OF THE INVENTION

The invention includes many aspects and features. Moreover, while many aspects and features relate to, and are described in, a particular context, the invention is not limited to use only in this context, as will become apparent from the following summaries and detailed descriptions of aspects, features, and one or more embodiments of the invention.

In an aspect of the invention, a method for storing information in a distributed network data storage system comprises: (a) using erasure code, encoding a data block of the information to generate an encoded data block comprising both parity data and the data block, wherein by using the erasure code the data block may be decoded from a subset of the encoded data block, the subset comprising less than all of the data block; and (b) distributing for storage portions of the subset of the encoded data block across a plurality of network storage locations such that the subset of the encoded data block is not stored in its entirety at any one of the plurality of network storage locations. In performing the distributing step, each portion of the subset of the encoded data block is communicated over a network to one of the plurality of network storage locations.

In another related aspect, a method for accessing information stored in a distributed network data storage system comprises: (a) retrieving distributed portions of a subset of an encoded data block from a plurality of network storage locations of the distributed network data storage system; (b) reconstituting the subset of the encoded data block from the distributed portions that are retrieved; and (e) using an erasure code, decoding the data block from the reconstituted subset of the encoded data block.

In a feature, one or more of the storage locations of the distributed network data storage system are geographically located nearer to a geographical location of a subsequent device for which it is determined that the subsequent device will access the information being stored.

In a feature, one of the storage locations of the distributed network data storage system comprises a subsequent device for which it is determined that the subsequent device will access the information being stored.

In a feature, at least one of the portions of the subset of the encoded data block is distributed to a subsequent networked electronic device for which it is determined that said subsequent networked electronic device will access the stored information, whereby a portion of the subset of the encoded data block is prepositioned for access by said subsequent networked electronic device.

In a feature of the invention, the erasure code is a linear block BCH code.

In a feature of the invention, the erasure code is a Reed Solomon code.

In a feature of the invention, the erasure code is a forward error correction code.

In a feature of the invention, the information comprises a password.

In a feature of the invention, the information comprises an encryption key.

In a feature of the invention, a difference between a total number of symbols of the encoded data block and a total number of symbols of the subset of the encoded data block is equal to or less than a total number of parity symbols of the encoded data block and greater than half of the total number of parity symbols of the encoded data block, such that, with knowledge of the positions of the symbols absent from the subset of the encoded data block, the data block may be decoded from the subset of the encoded data block using the erasure code.

In a feature of the invention, a difference between a total number of symbols of the encoded data block and a total number of symbols of the subset of the encoded data block is equal to or less than half of a total number of parity symbols of the encoded data block, such that by using the erasure code the data block may be decoded from the subset of the encoded data block.

In a feature of the invention, the encoded data block has a size of 255 bytes and the subset of the encoded data block has a size of not less than 239 bytes, symbols of the data block each consisting of 8 bits. Preferably, the subset of the encoded data block comprises 32 parity bytes.

In a feature of the invention, the encoded data block has a size of 255 bytes and the subset of the encoded data block has a size of not less than 223 bytes, symbols of the data block each consisting of 8 bits. Preferably, the subset of the encoded data block comprises 32 parity bytes.

In another aspect of the invention, a method for writing and reading information in a distributed network data storage system comprises, for each of one or more data blocks of the information, the steps of: (a) writing the data block of the information to the distributed network data storage system by (i) using erasure code, encoding the data block of the information to generate an encoded data block comprising both parity data and the data block, wherein by using the erasure code the data block may be decoded from a subset of the encoded data block, the subset comprising less than all of the data block, and (ii) distributing for storage portions of the subset of the encoded data block across a plurality of network storage locations of the distributed network data storage system such that the encoded data block is not stored in its entirety at any one of the plurality of network storage locations, wherein said distributing comprises communicating each portion of the subset of the encoded data block over a network to one of the plurality of network storage locations; and (b) reading the data block of the information from the distributed network data storge system by (i) retrieving the distributed portions of the subset of the encoded data block from the plurality of network storage locations of the distributed network data storage system, (ii) reconstituting the subset of the encoded data block from the distributed portions that are retrieved, and (iii) using the erasure code, decoding the data block from the reconstituted subset of the encoded data block.

In another aspect, a method for storing and accessing information in a distributed network data storage system, comprises: (a) using erasure code, encoding a data block of the information to generate an encoded data block comprising both parity data and the data block, wherein by using the erasure code the data block may be decoded from a subset of the encoded data block, the subset comprising less than all of the data block; (b) making alterations to the subset of the encoded data block such that the data block cannot be decoded using the erasure code; (c) distributing for storage portions of the altered subset of the encoded data block across a plurality of network storage locations such that the altered subset of the encoded data block is not stored in its entirety at any one of the plurality of network storage locations, wherein said distributing comprises communicating each portion of the altered subset of the encoded data block over a network to one of the plurality of network storage locations; (d) retrieving the distributed portions of the altered subset of the encoded data block from the plurality of network storage locations of the distributed network data storage system; (e) reconstituting the altered subset of the encoded data block from the distributed portions that are retrieved; (f) reversing the alterations made to the reconstituted altered subset of the encoded data block to restore the subset of the encoded data block; and (g) using the erasure code, decoding the data block from the reconstituted subset of the encoded data block.

In a feature, the step of making alterations to the subset of the encoded data block comprises altering a bit of each of a plurality of symbols of the subset, wherein each symbol of the subset that is altered is not a parity symbol. Preferably, a difference between a total number of symbols of the encoded data block and a total number of unaltered symbols of the altered subset of the encoded data block is equal to or less than a total number of parity symbols of the encoded data block and greater than half of the total number of parity symbols of the encoded data block, such that, with knowledge of the positions of the symbols absent from the subset of the encoded data block, the data block may be decoded from the reconstituted subset of the encoded data block using the erasure code. More preferably, a total of the difference and a total number of altered symbols of the altered subset of the encoded data block exceeds the total number of parity symbols of the encoded data block.

In a feature, the step of making alterations to the subset of the encoded data block comprises altering a bit of each of a plurality of symbols of the subset, wherein each symbol of the subset that is altered is not a parity symbol, and a difference between a total number of symbols of the encoded data block and a total number of unaltered symbols of the subset of the encoded data block is equal to or less than half of a total number of parity symbols of the encoded data block, such that by using the erasure code the data block may be decoded from the reconstituted subset of the encoded data block. Preferably, a total of the difference and a total number of altered symbols of the altered subset of the encoded data block exceeds the total number of parity symbols of the encoded data block.

In the above described aspects and features, the methods preferably are performed by one or more networked electronic devices. Suh devices may comprise, by way of example and not limitation, a desktop computer; a laptop computer; a phone; a tablet; a wearable such as a watch; a satellite; a transport vehicle such as an automobile, bus, train, ship, or plane that comprises one or more processors, memory, and wireless network connection; or a server such as a server at a data center forming a node in a wide area network. Moreover, one or more such electronic networked devices preferably are connected for communications over the Internet or other large network. The network may comprise an overlay or software-defined network, and may comprise a public network or a private network.

In another aspect, a method performed at a first networked electronic device for communicating a data block to a second networked electronic device comprises: (a) using erasure code, encoding a data block of the information to generate an encoded data block comprising both parity data and the data block, wherein by using the erasure code the data block may be decoded from a subset of the encoded data block, the subset comprising less than all of the data block; (b) making alterations to the subset of the encoded data block such that the data block cannot be decoded using the erasure code; (c) communicating to the second networked electronic device the altered subset of the encoded data block by sending the altered subset of the encoded data block within one or more data packets over a network to the second networked electronic device; and (d) communicating to the second networked electronic device information for reversing the alterations made to the subset of the enclosed data block such that the modifications made can be reversed and the data block decoded from the subset by the second networked electronic device.

In a feature, said step of communicating, to the second networked electronic device, information for reversing the alterations made to the subset of the enclosed data block comprises signaling symbols to the second networked electronic device based on network paths by which data packets are received by the second networked electronic device from the first networked electronic device.

In a feature, one or more of the data packets in said step (d) are directly sent from the first networked electronic device to the second networked electronic device.

In a feature, one or more of the data packets in said step (d) are indirectly sent from the first networked electronic device to the second networked electronic device.

In a feature, the step of making alterations to the subset of the encoded data block comprises altering a bit of each of a plurality of symbols of the subset, wherein each symbol of the subset that is altered is not a parity symbol.

In a feature, a difference between a total number of symbols of the encoded data block and a total number of unaltered symbols of the altered subset of the encoded data block is equal to or less than a total number of parity symbols of the encoded data block and greater than half of the total number of parity symbols of the encoded data block, such that, with knowledge of the positions of the symbols absent from the subset of the encoded data block, the data block may be decoded from the subset of the encoded data block using the erasure code, and a different but seemingly valid data block may be obtained from the altered subset of the encoded data block using the erasure code.

In a feature, a difference between a total number of symbols of the encoded data block and a total number of unaltered symbols of the subset of the encoded data block is equal to or less than half of a total number of parity symbols of the encoded data block, such that by using the erasure code the data block may be decoded from the subset of the encoded data block and a different but seemingly valid data block may be obtained from the altered subset of the encoded data block.

Another aspect of the invention relates to a system in which the method of any one of the foregoing method claims is performed.

Another aspect of the invention relates to an electronic device having one or more network connections and configured to perform the method any one of the foregoing method claims.

Another aspect of the invention relates to an electronic device comprising machine-readable media containing machine-executable instructions for performing the method any one of the foregoing method claims.

Another aspect of the invention relates to a system comprising the electronic device of any one of the foregoing device claims.

Another aspect of the invention relates to a method as disclosed herein.

Another aspect of the invention relates to a device as disclosed herein.

Another aspect of the invention relates to a system as disclosed herein.

In addition to the aforementioned aspects and features of the invention, it should be noted that the invention further encompasses the various logical combinations and subcombinations of such aspects and features. Thus, for example, claims in this or a divisional or continuing patent application or applications may be separately directed to any aspect, feature, or embodiment disclosed herein, or combination thereof, without requiring any other aspect, feature, or embodiment.

BRIEF DESCRIPTION OF THE DRAWINGS

One or more preferred embodiments of the invention now will be described in detail with reference to the accompanying drawings, wherein the same elements are referred to with the same reference numerals.

FIG. 22 is another schematic illustration of the encoded data block of FIG. 21, wherein each byte is represented.

FIG. 23 is schematic illustration of an encoded data block buffered for communication of portions thereof to different storage locations in a distributed data storage system in accordance with a first preferred method.

FIG. 24 is schematic illustration of an encoded data block buffered for communication of portions thereof to different storage locations in a distributed data storage system in accordance with a second preferred method.

FIG. 25 is a table contrasting communications of the portions of the encoded data blocks of FIGS. 23 and 24 in accordance with the first and second methods, respectively.

FIG. 26 is a copy of FIG. 22, reproduced here for ease of reference when considering FIGS. 27-29.

FIG. 27 is the schematic illustration of FIG. 23 upon communication of a first portion of a subset of the encoded data block to a storage location in the distributed data storage system in accordance with the first preferred method.

FIG. 28 is the schematic illustration of FIG. 24 upon communication of a first portion of a subset of the encoded data block to a storage location in the distributed data storage system in accordance with the second preferred method.

FIG. 29 is the table of FIG. 25 following communications of the first portion in accordance with the first and second methods.

FIG. 30 is a copy of FIG. 22, reproduced here for ease of reference when considering FIGS. 31-33.

FIG. 31 is the schematic illustration of FIG. 23 upon communication of a second portion of a subset of the encoded data block to a storage location in the distributed data storage system in accordance with the first preferred method.

FIG. 32 is the schematic illustration of FIG. 24 upon communication of a second portion of a subset of the encoded data block to a storage location in the distributed data storage system in accordance with the second preferred method.

FIG. 33 is the table of FIG. 25 following communications of the second portion in accordance with the first and second methods.

FIG. 34 is a copy of FIG. 22, reproduced here for ease of reference when considering FIGS. 35-37.

FIG. 35 is the schematic illustration of FIG. 23 upon communication of a third portion of a subset of the encoded data block to a storage location in the distributed data storage system in accordance with the first preferred method.

FIG. 36 is the schematic illustration of FIG. 24 upon communication of a third portion of a subset of the encoded data block to a storage location in the distributed data storage system in accordance with the second preferred method.

FIG. 37 is the table of FIG. 25 following communications of the third portion in accordance with the first and second methods.

FIG. 38 is a copy of FIG. 22, reproduced here for ease of reference when considering FIGS. 39-41.

FIG. 39 is the schematic illustration of FIG. 23 upon communication of a fourth portion of a subset of the encoded data block to a storage location in the distributed data storage system in accordance with the first preferred method.

FIG. 40 is the schematic illustration of FIG. 24 upon communication of a fourth portion of a subset of the encoded data block to a storage location in the distributed data storage system in accordance with the second preferred method.

FIG. 41 is the table of FIG. 25 following communications of the fourth portion in accordance with the first and second methods.

FIG. 42 is a copy of FIG. 22, reproduced here for ease of reference when considering FIGS. 43-45.

FIG. 43 is the schematic illustration of FIG. 23 upon communication of a fifth portion of a subset of the encoded data block to a storage location in the distributed data storage system in accordance with the first preferred method.

FIG. 44 is the schematic illustration of FIG. 24 upon communication of a fifth portion of a subset of the encoded data block to a storage location in the distributed data storage system in accordance with the second preferred method.

FIG. 45 is the table of FIG. 25 following communications of the fifth portion in accordance with the first and second methods.

FIG. 46 is a copy of FIG. 22, reproduced here for ease of reference when considering FIGS. 47-49.

FIG. 47 is the schematic illustration of FIG. 23 upon clearing the buffer of the remaining data blocks that were omitted from the portions of the subset that were communicated for storage at the storage locations in the distributed data storage system.

FIG. 48 is the schematic illustration of FIG. 24 upon clearing the buffer of the remaining data blocks that were omitted from the portions of the subset that were communicated for storage at the storage locations in the distributed data storage system.

FIG. 49 is the table of FIG. 25, reproduced here for ease of reference when considering FIGS. 47-48.

FIG. 50 is a copy of FIG. 22, reproduced here for ease of reference when considering FIGS. 51-53.

FIG. 51 is a schematic illustration of the encoded data block of FIG. 50 after alterations have been made to a plurality of the bytes of the encoded data block, each altered byte being indicated by an exclamation sign "!" and each byte to be omitted being indicated by a black square when a subset of the altered encoded data block is sent in accordance with a third exemplary method of the invention.

FIG. 52 is a schematic illustration of the encoded data block of FIG. 50 after an alteration has been made to a byte of the encoded data block, the altered byte being indicated by an exclamation sign "!" and each byte to be omitted being indicated by a black square when a subset of the altered encoded data block is sent in accordance with a fourth exemplary method of the invention.

FIG. 53 is a table contrasting communication of a subset of the altered encoded data block of FIG. 51 in accordance with the third exemplary method of the invention with communication of a subset of the altered encoded data block of FIG. 52 in accordance with the third exemplary method of the invention.

DETAILED DESCRIPTION

Figure 1:
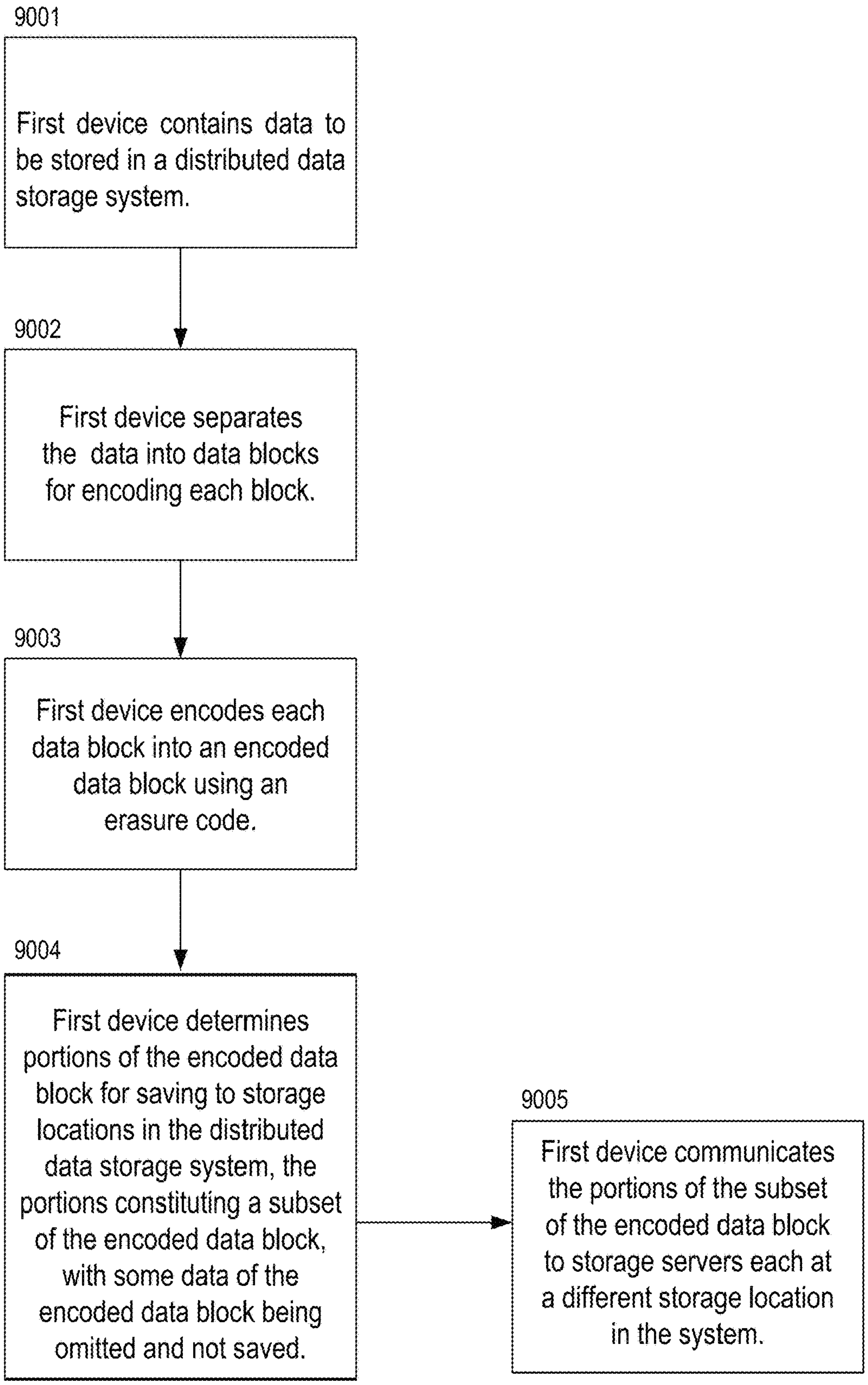
FIG. 1 is a flowchart of steps of an exemplary method for storing data in a distributed data storage system.

As a preliminary matter, it will readily be understood by one having ordinary skill in the relevant art ("Ordinary Artisan") that the invention has broad utility and application. Furthermore, any embodiment discussed and identified as being "preferred" is considered to be part of a best mode contemplated for carrying out the invention. Other embodiments also may be discussed for additional illustrative purposes in providing a full and enabling disclosure of the invention. Furthermore, an embodiment of the invention may incorporate only one or a plurality of the aspects of the invention disclosed herein; only one or a plurality of the features disclosed herein; or combination thereof. As such, many embodiments are implicitly disclosed herein and fall within the scope of what is regarded as the invention.

Accordingly, while the invention is described herein in detail in relation to one or more embodiments, it is to be understood that this disclosure is illustrative and exemplary of the invention and is made merely for the purposes of providing a full and enabling disclosure of the invention. The detailed disclosure herein of one or more embodiments is not intended, nor is to be construed, to limit the scope of patent protection afforded the invention in any claim of a patent issuing here from, which scope is to be defined by the claims and the equivalents thereof. It is not intended that the scope of patent protection afforded the invention be defined by reading into any claim a limitation found herein that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the invention. Accordingly, it is intended that the scope of patent protection afforded the invention be defined by the issued claim(s) rather than the description set forth herein.

Additionally, it is important to note that each term used herein refers to that which the Ordinary Artisan would understand such term to mean based on the contextual use of such term herein. To the extent that the meaning of a term used herein—as understood by the Ordinary Artisan based on the contextual use of such term—differs in any way from any particular dictionary definition of such term, it is intended that the meaning of the term as understood by the Ordinary Artisan should prevail.

With regard solely to construction of any claim with respect to the United States, no claim element is to be interpreted under 35 U.S.C. 112(f) unless the explicit phrase “means for” or “step for” is actually used in such claim element, whereupon this statutory provision is intended to and should apply in the interpretation of such claim element. With regard to any method claim including a condition precedent step, such method requires the condition precedent to be met and the step to be performed at least once but not necessarily every time during performance of the claimed method.

Furthermore, it is important to note that, as used herein, “comprising” is open-ended insofar as that which follows such term is not exclusive. Additionally, “a” and “an” each generally denotes “at least one” but does not exclude a plurality unless the contextual use dictates otherwise. Thus, reference to “a picnic basket having an apple” is the same as “a picnic basket comprising an apple” and “a picnic basket including an apple”, each of which identically describes “a picnic basket having at least one apple” as well as “a picnic basket having apples”; the picnic basket further may contain one or more other items beside an apple. In contrast, reference to “a picnic basket having a single apple” describes “a picnic basket having only one apple”; the picnic basket further may contain one or more other items beside an apple. In contrast, “a picnic basket consisting of an apple” has only a single item contained therein, i.e., one apple; the picnic basket contains no other item.

When used herein to join a list of items, “or” denotes “at least one of the items” but does not exclude a plurality of items of the list. Thus, reference to “a picnic basket having cheese or crackers” describes “a picnic basket having cheese without crackers”, “a picnic basket having crackers without cheese”, and “a picnic basket having both cheese and crackers”; the picnic basket further may contain one or more other items beside cheese and crackers.

When used herein to join a list of items, “and” denotes “all of the items of the list”. Thus, reference to “a picnic basket having cheese and crackers” describes “a picnic basket having cheese, wherein the picnic basket further has crackers”, as well as describes “a picnic basket having crackers, wherein the picnic basket further has cheese”; the picnic basket further may contain one or more other items beside cheese and crackers.

The phrase “at least one” followed by a list of items joined by “and” denotes an item of the list but does not require every item of the list. Thus, “at least one of an apple and an orange” encompasses the following mutually exclusive scenarios: there is an apple but no orange; there is an orange but no apple; and there is both an apple and an orange. In these scenarios if there is an apple, there may be more than one apple, and if there is an orange, there may be more than one orange. Moreover, the phrase “one or more” followed by a list of items joined by “and” is the equivalent of “at least one” followed by the list of items joined by “and”.

Referring now to the drawings, one or more preferred embodiments of the invention are next described. The following description of one or more preferred embodiments is merely exemplary in nature and is in no way intended to limit the invention, its implementations, or uses.

FIG. 1 illustrates steps of an exemplary method for storing data in a distributed data storage system in accordance with one or more preferred implementations, and each of FIGS. 2-10 schematically illustrates performance of steps of FIG. 1.

Figure 2:
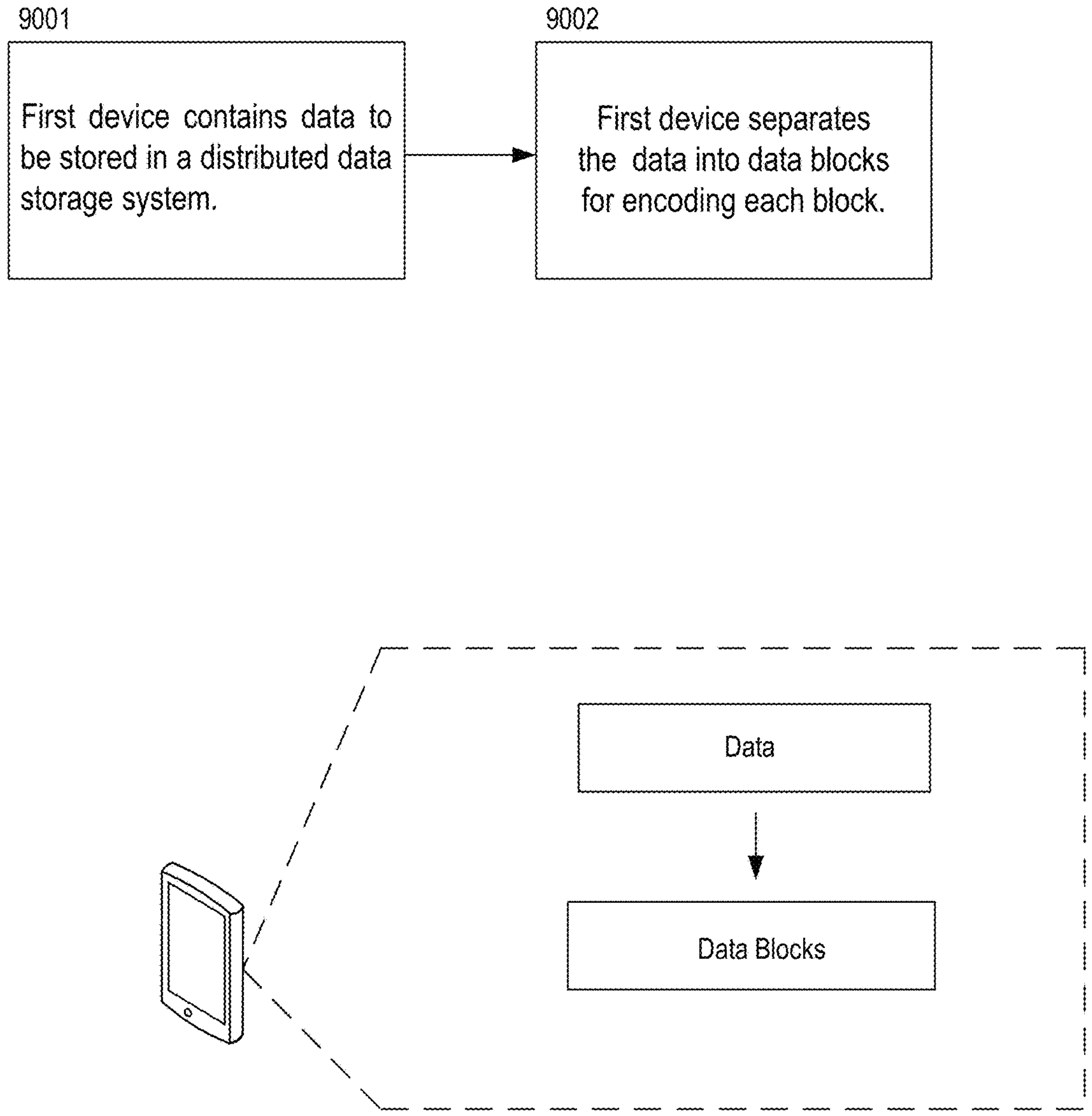
FIG. 2 is a schematic illustration of performance of a step of the method of FIG. 1.

As schematically illustrated in FIG. 2, at step 9001 a first device has data to be stored in a distributed data storage system, and at step 9002 the data is separated into a plurality of data blocks for encoding.

Figure 3:
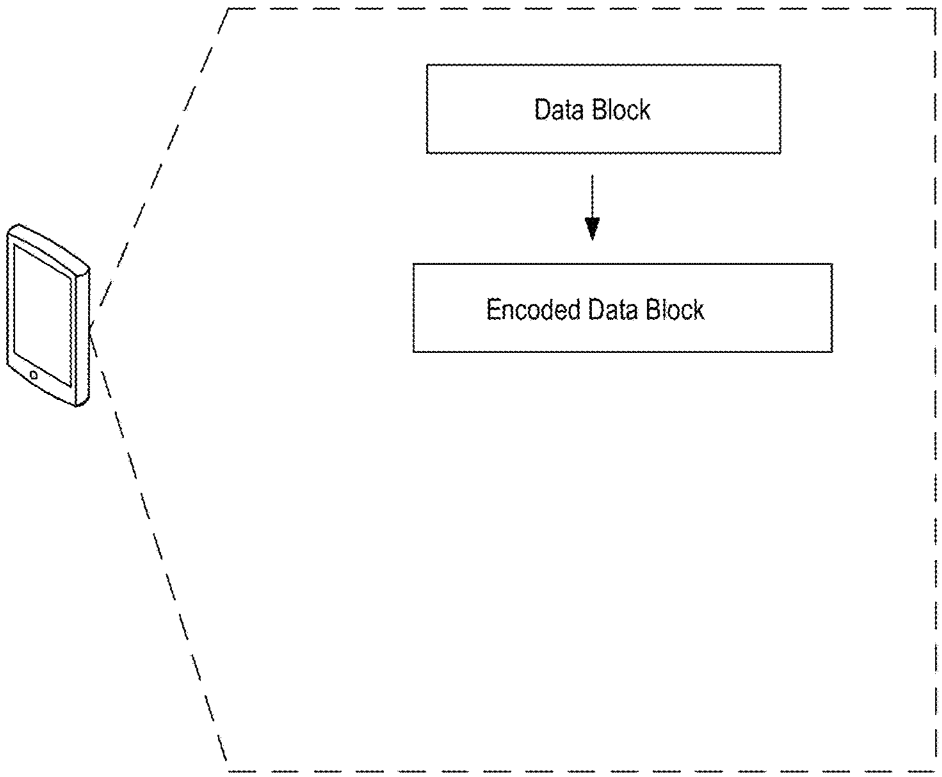
FIG. 3 is a schematic illustration of performance of a step of the method of FIG. 1.

As illustrated in FIG. 3, at step 9003 the first device encodes each data block into an encoded data block using an erasure code.

Figure 4:
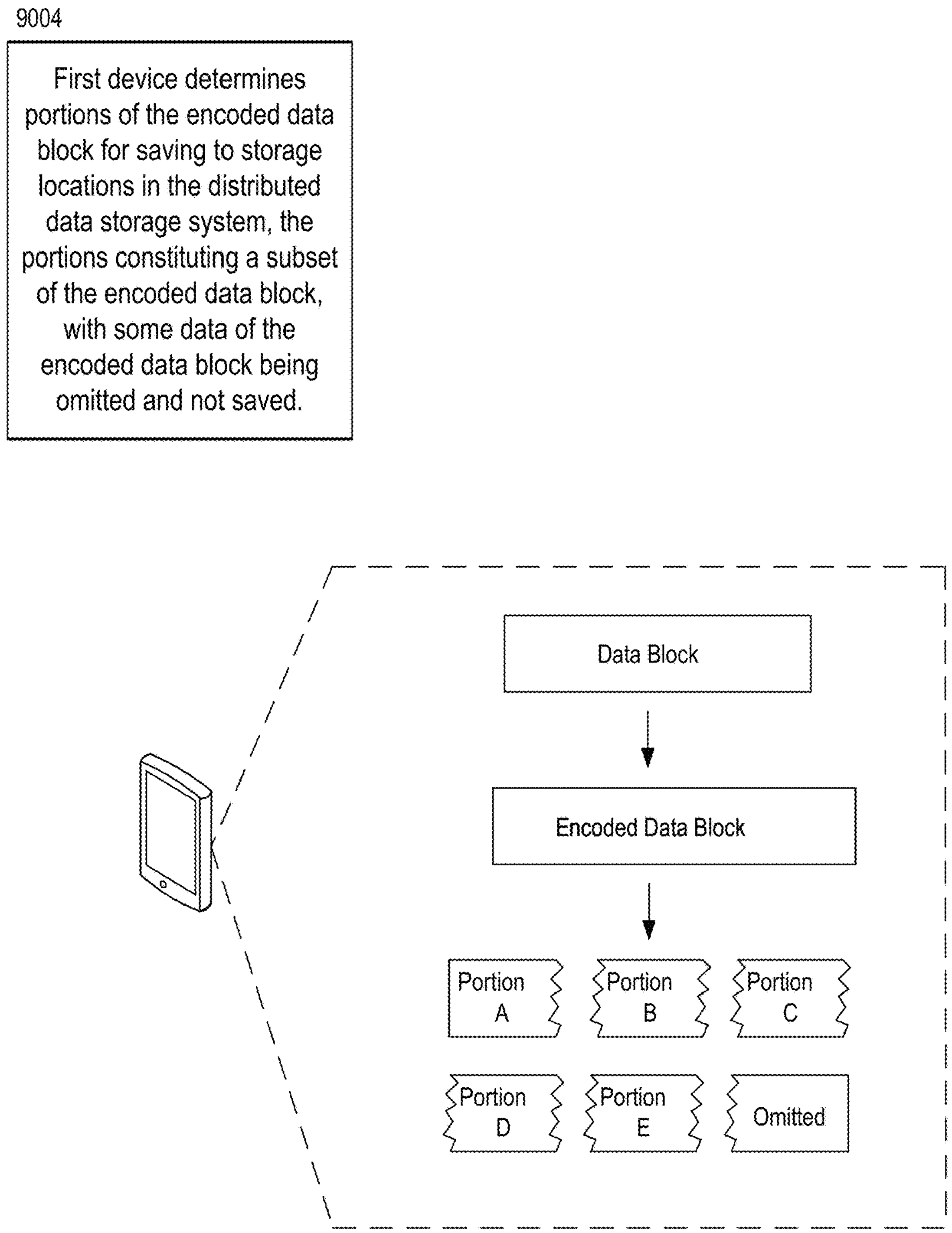
FIG. 4 is a schematic illustration of performance of a step of the method of FIG. 1.

As illustrated in FIG. 4, at step 9004 the first device determines portions of the encoded data block for saving to storage locations in the distributed data storage system.

In certain circumstances it may be possible to determine with a measure of confidence a subsequent device that may access the data block being stored. Accordingly, in preferred embodiments one or more of the storage locations of the distributed network data storage system are geographically located nearer to a geographical location of such a subsequent device for which it is determined that the subsequent device will access the information being stored. Moreover, such a storage location may comprise the subsequent device for which it is determined that the subsequent device will access the information being stored.

In preferred embodiments, and in some such scenarios, at least one of the portions of the subset of the encoded data block is distributed to such a subsequent networked electronic device for which it is determined that said subsequent networked electronic device will access the stored information, whereby a portion of the subset of the encoded data block is prepositioned for access by said subsequent networked electronic device. This does not require that the subsequent networked electronic device be deemed a “storage location” in the distributed network data storage system and may simply be a “client” device that uses the distributed network data storage system for storing and/or accessing information. As an example, portions of the subset of the encoded data may be distributed to a plurality of other devices of a user of the first device, whereby some of the data is prepositioned on other devices of the user for accessing the information being stored in the distributed data storage system. In this case the first device of the user also may store one or more portions of the subset, especially if the original data block is not going to be maintained at the first device.

Figure 5:
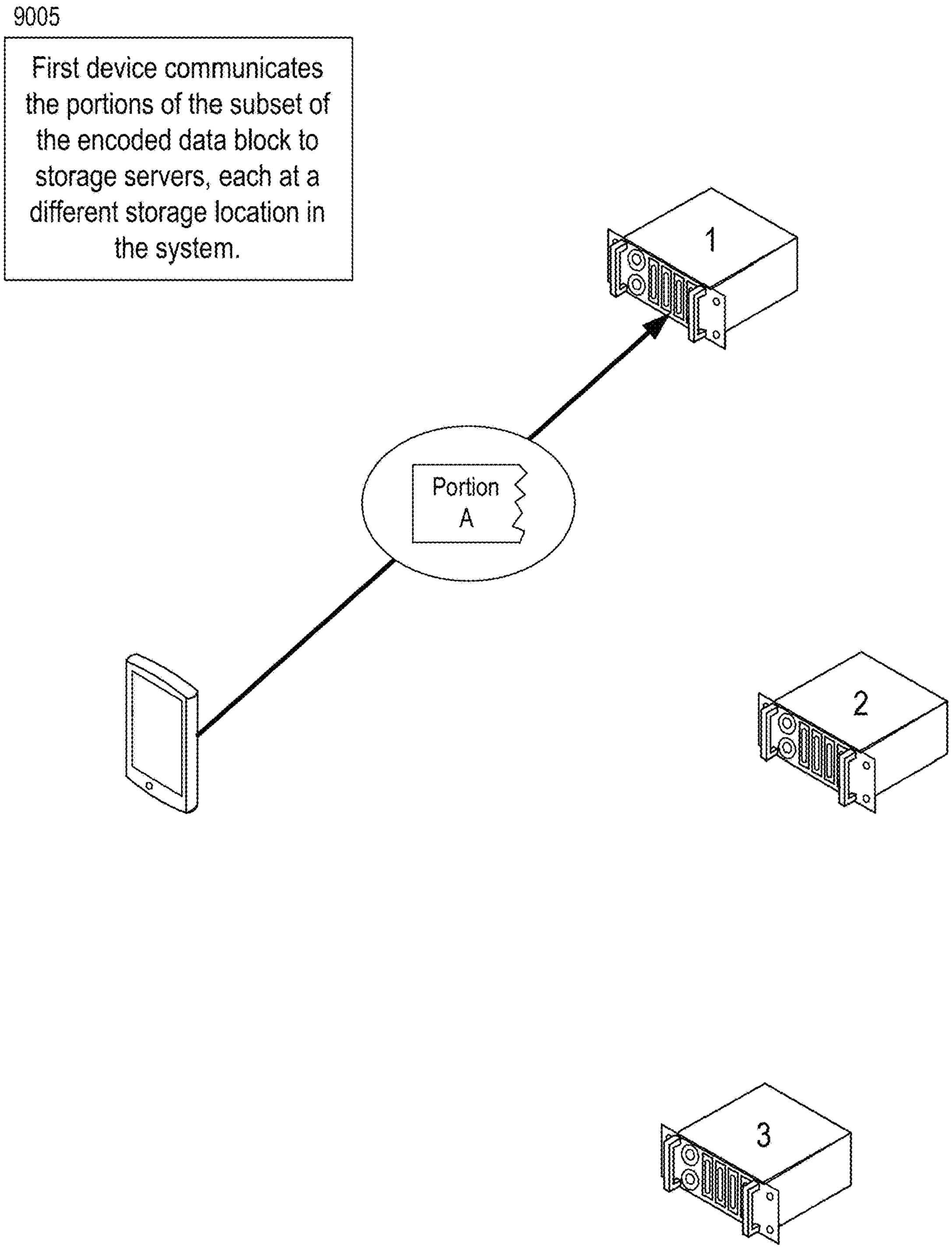
FIGS. 5-9 collectively illustrates performance of a step of the method of FIG. 1.
Figure 6:
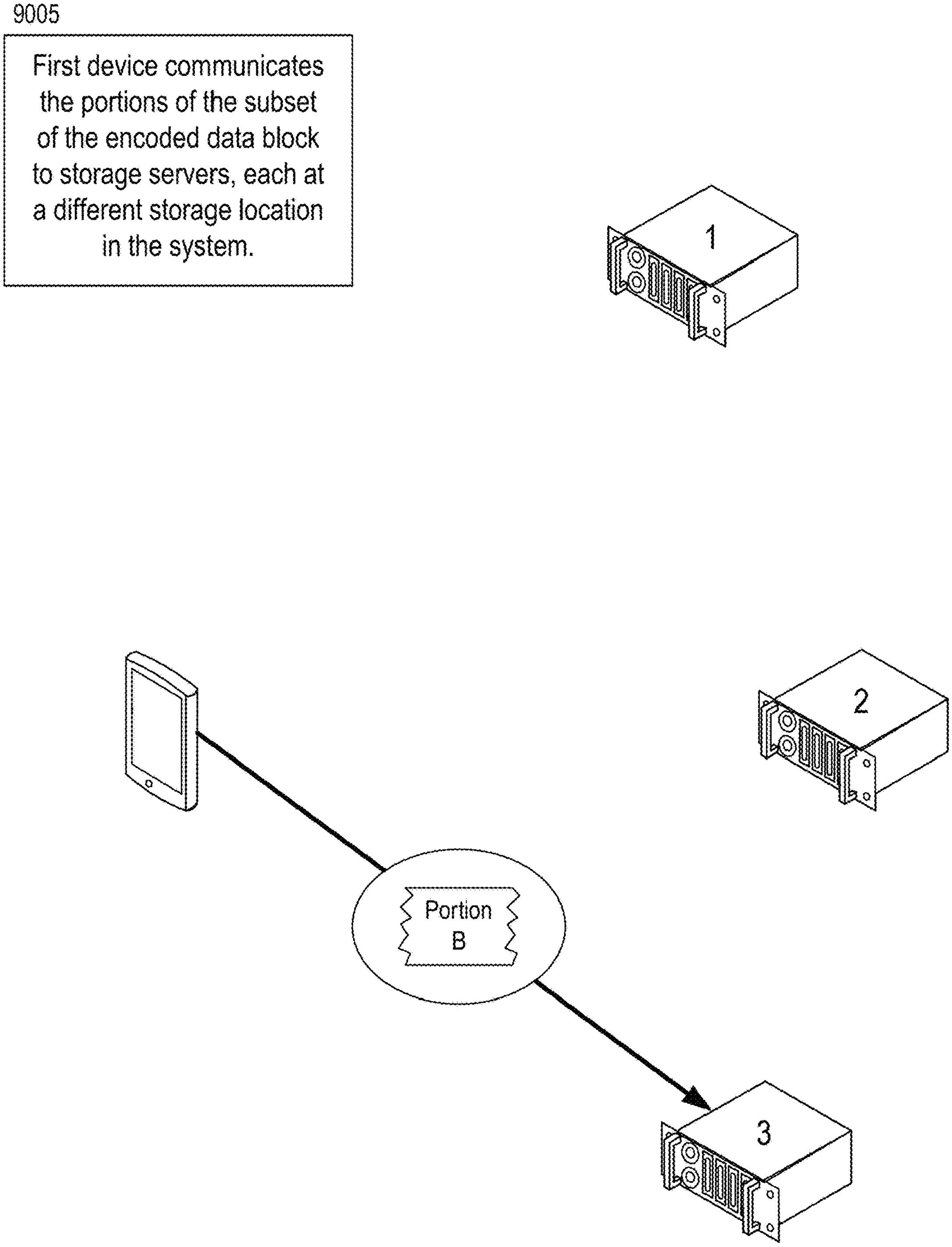
Figure 7:
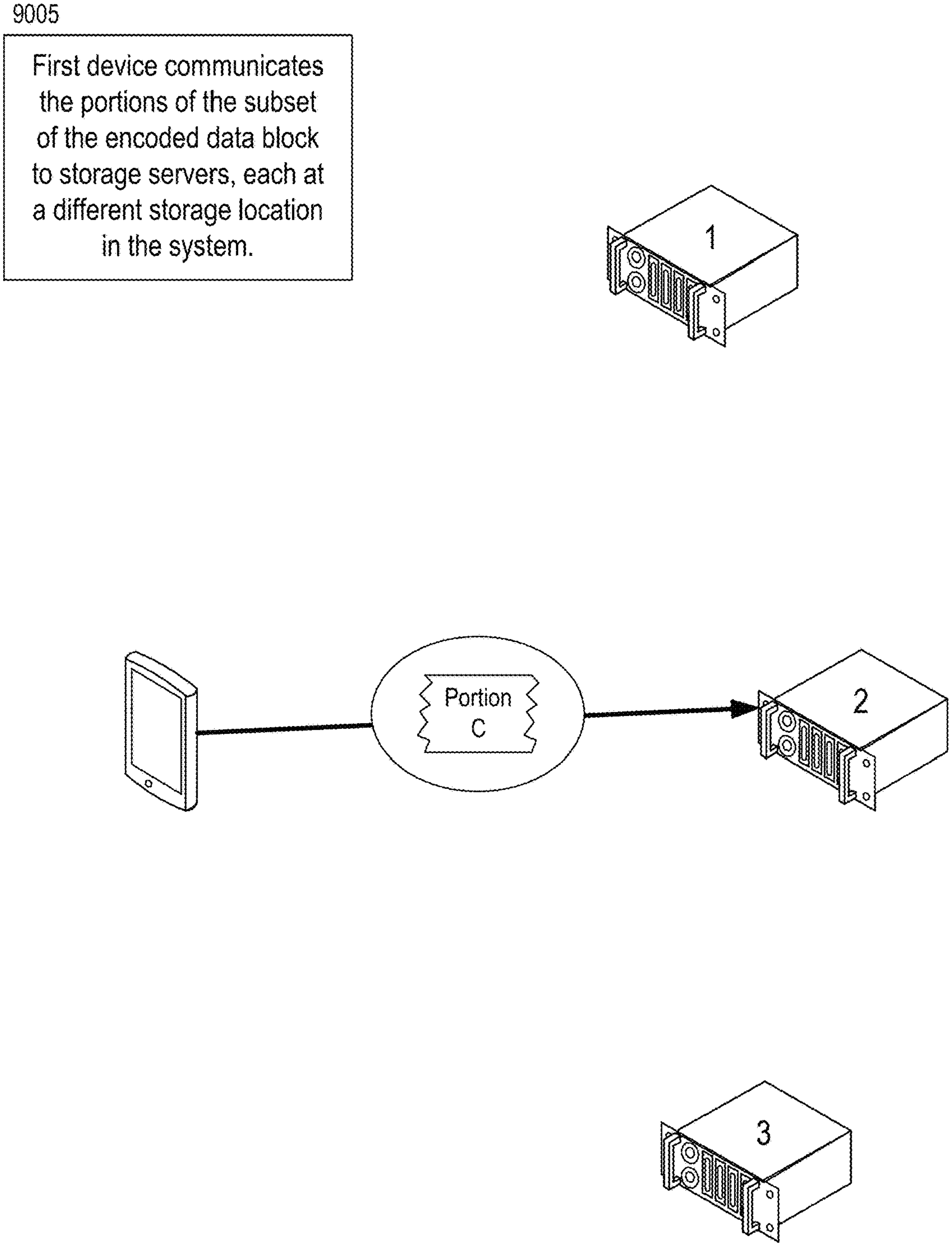
Figure 8:
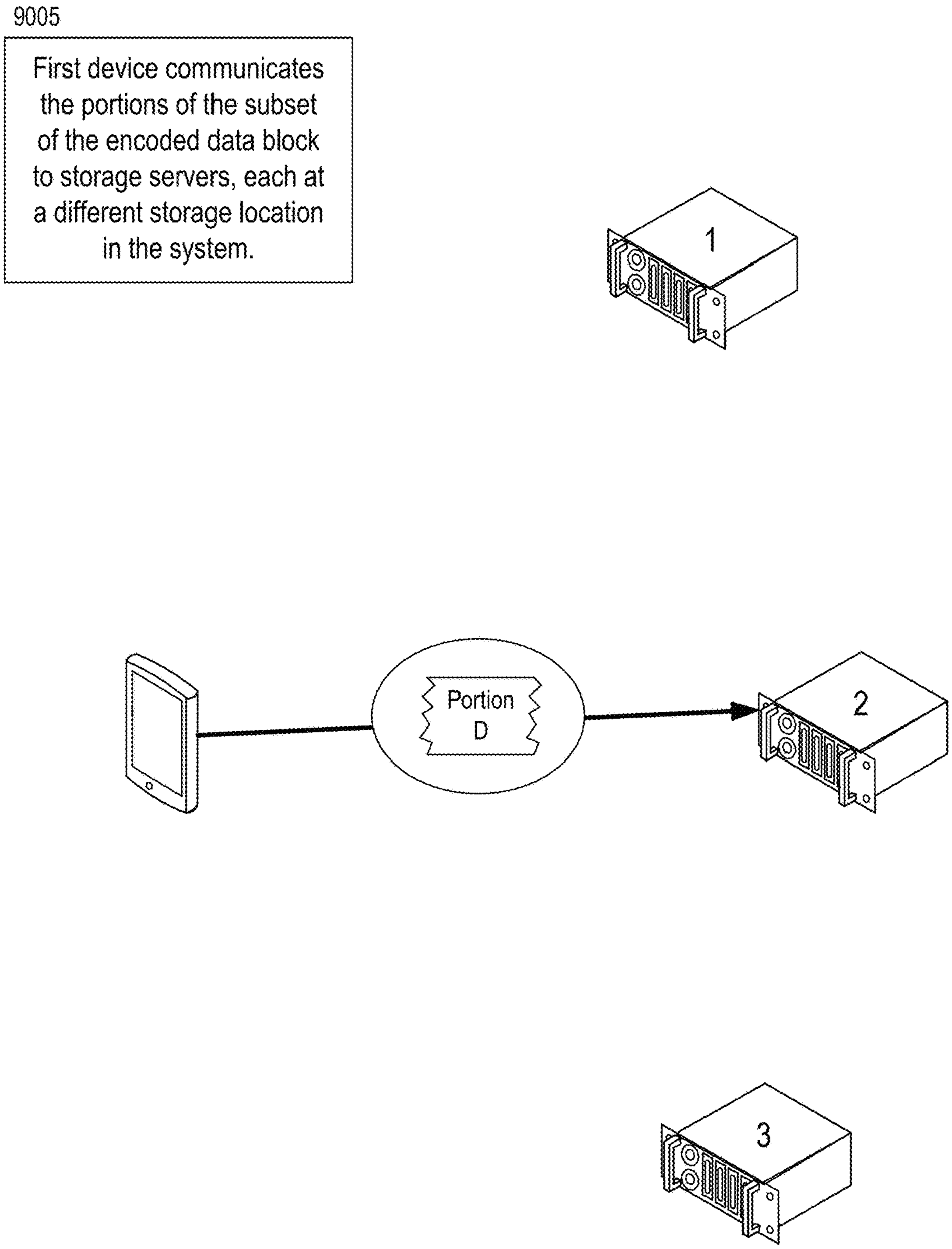
Figure 9:
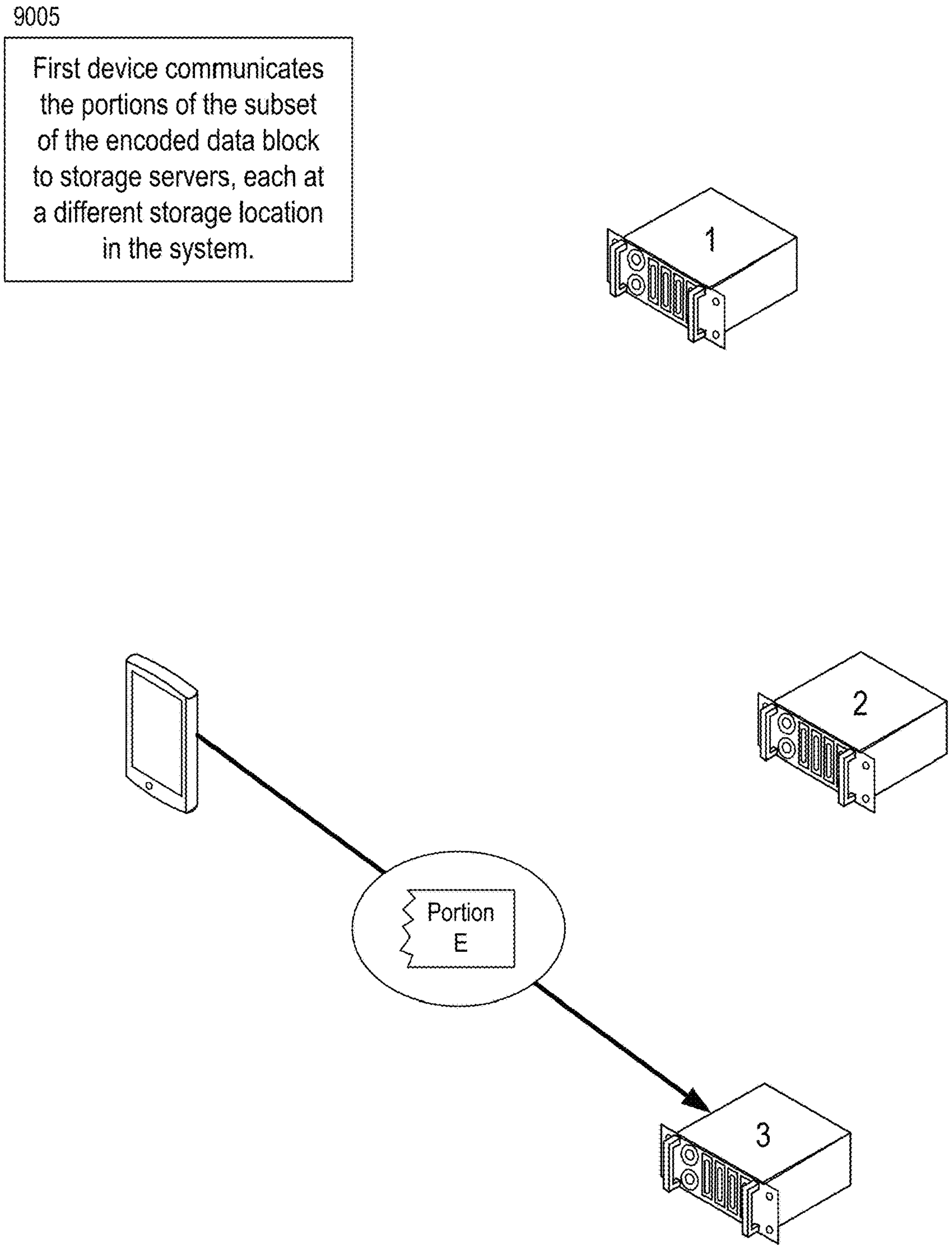
Figure 10:
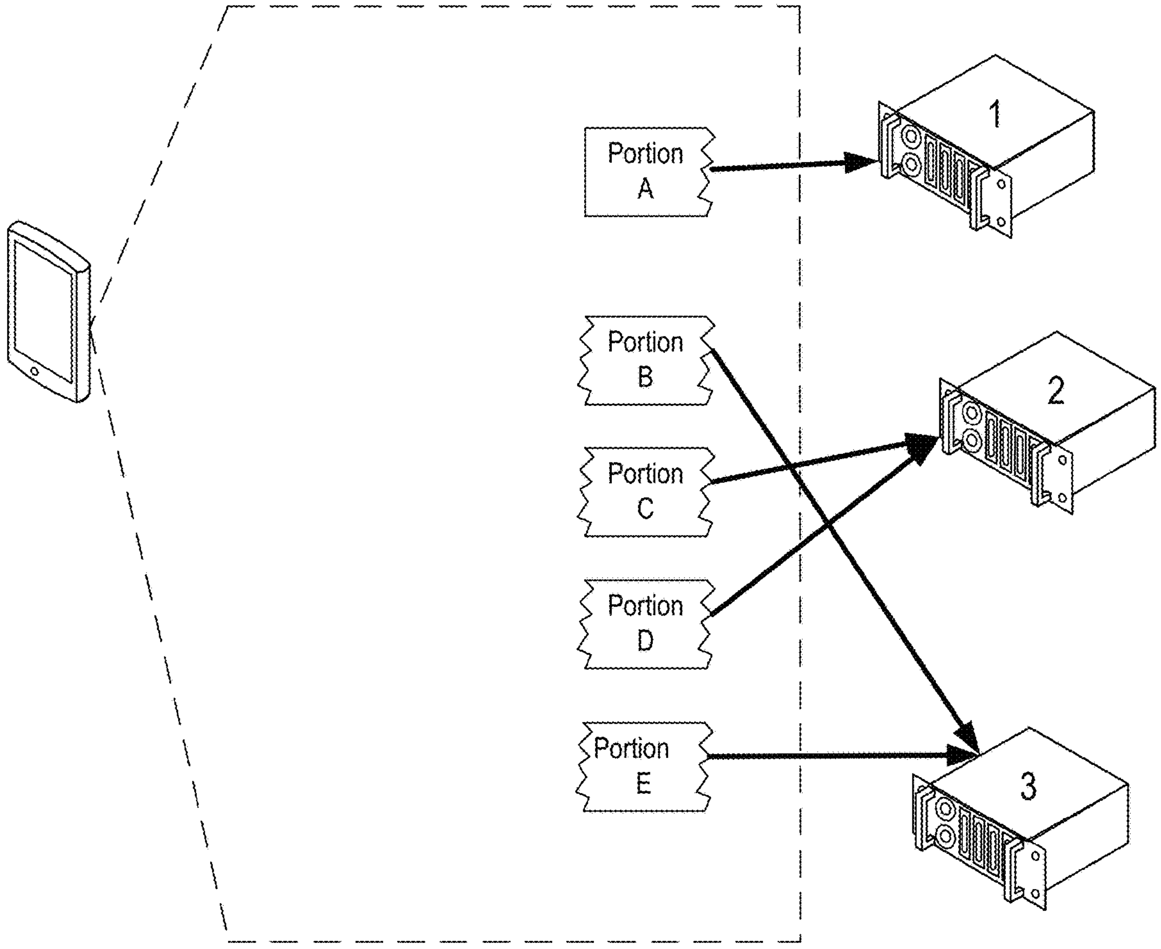
FIG. 10 illustrates in summary manner the performances of FIGS. 5-9.
Figure 11:
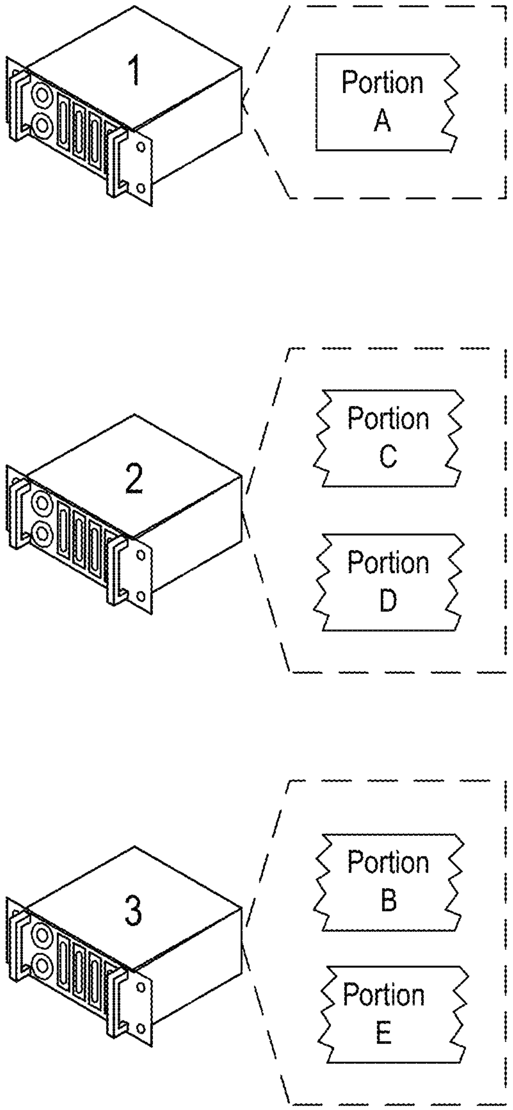
FIG. 11 is a schematic illustration of the resulting stored data in the distributed data storage system after performance of the method of FIG. 1.

In greater detail, and as broadly illustrated in FIG. 5-9, at step 9005 the first device communicates the portions of the subset of the encoded data block to storage servers, each at a different storage location in the system. Specifically, the first device communicates portion A to a first storage server (storage server #1), as illustrated in FIG. 5; communicates portion B to another storage server (storage server #3), as illustrated in FIG. 6; communicates portion C to yet another storage server (storage server #2), as illustrated in FIG. 7; communicates portion D also to the storage server #2, as illustrated in FIG. 8; and communicates portion E to the storage server #3, as illustrated in FIG. 9. In recap, FIG. 10 illustrates the communications of these portions to the storage locations in the distributed data storage system; and FIG. 11 illustrates the resulting storage of these portions at the storage servers following such communications.

Notably, the portions of the encoded data block constitute a subset of the encoded data block because the portions do not contain all of the data of the encoded data block; data of the encoded data block schematically identified in FIG. 4 as “Omitted” is not stored in the distributed data storage system, nor the omitted data stored at the first device.

Figure 12:
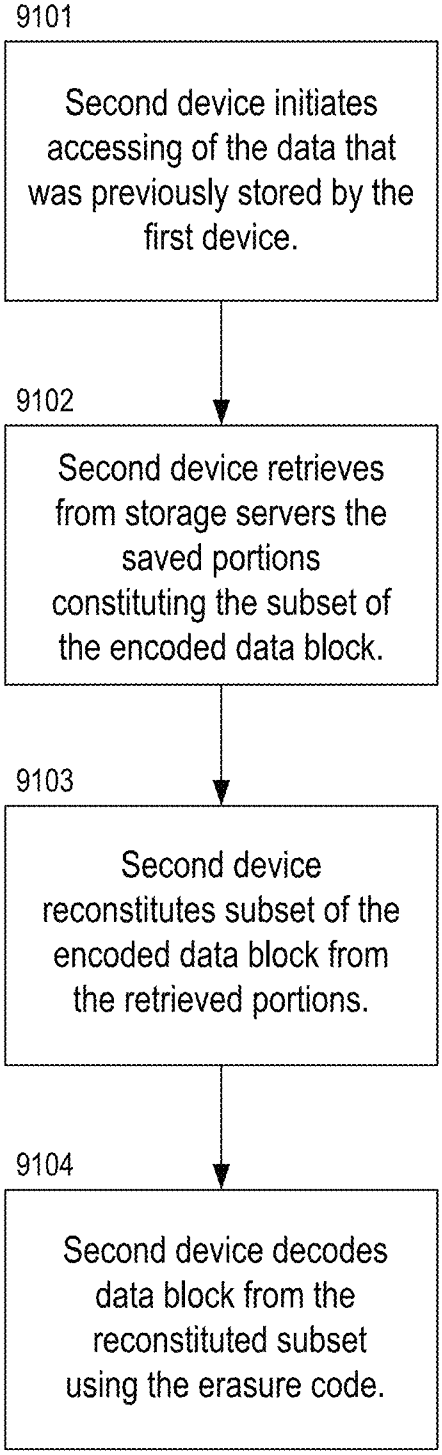
FIG. 12 is a flowchart of steps of an exemplary method for accessing data in the distributed data storage system.

FIG. 12 illustrates steps of an exemplary method for accessing stored data in a distributed data storage system in accordance with one or more preferred implementations, and each of FIGS. 13-19 schematically illustrates performance of steps of FIG. 12.

At the initial step 9101, a second device initiates accessing of the data that was previously stored by the first device in the distributed data storage system, as discussed above. The illustration is in the context of a second device accessing the stored data, but the illustration applies likewise to the first device accessing the stored data.

Figure 13:
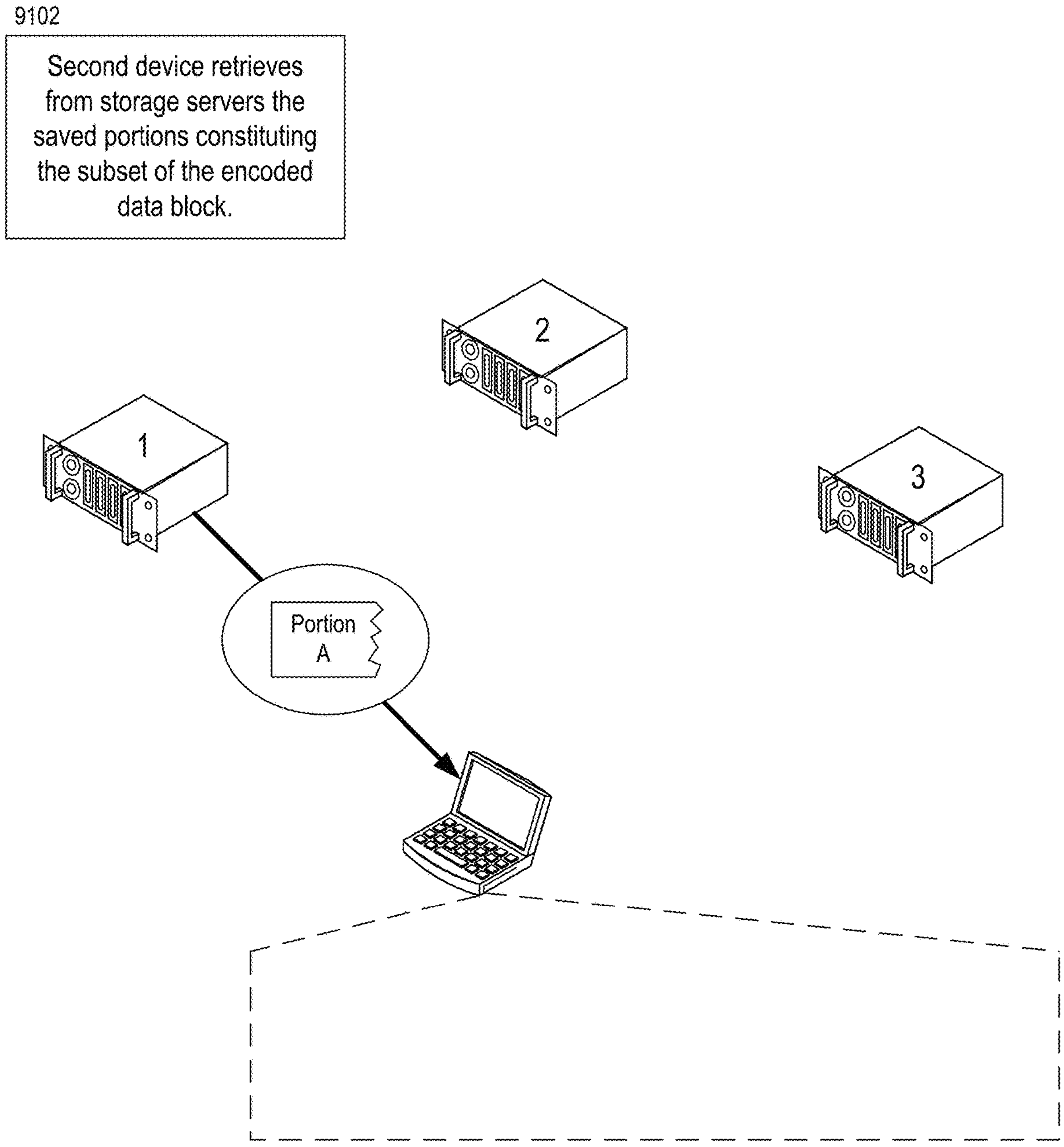
FIGS. 13-17 collectively illustrate performance of a step of the method of FIG. 12.
Figure 14:
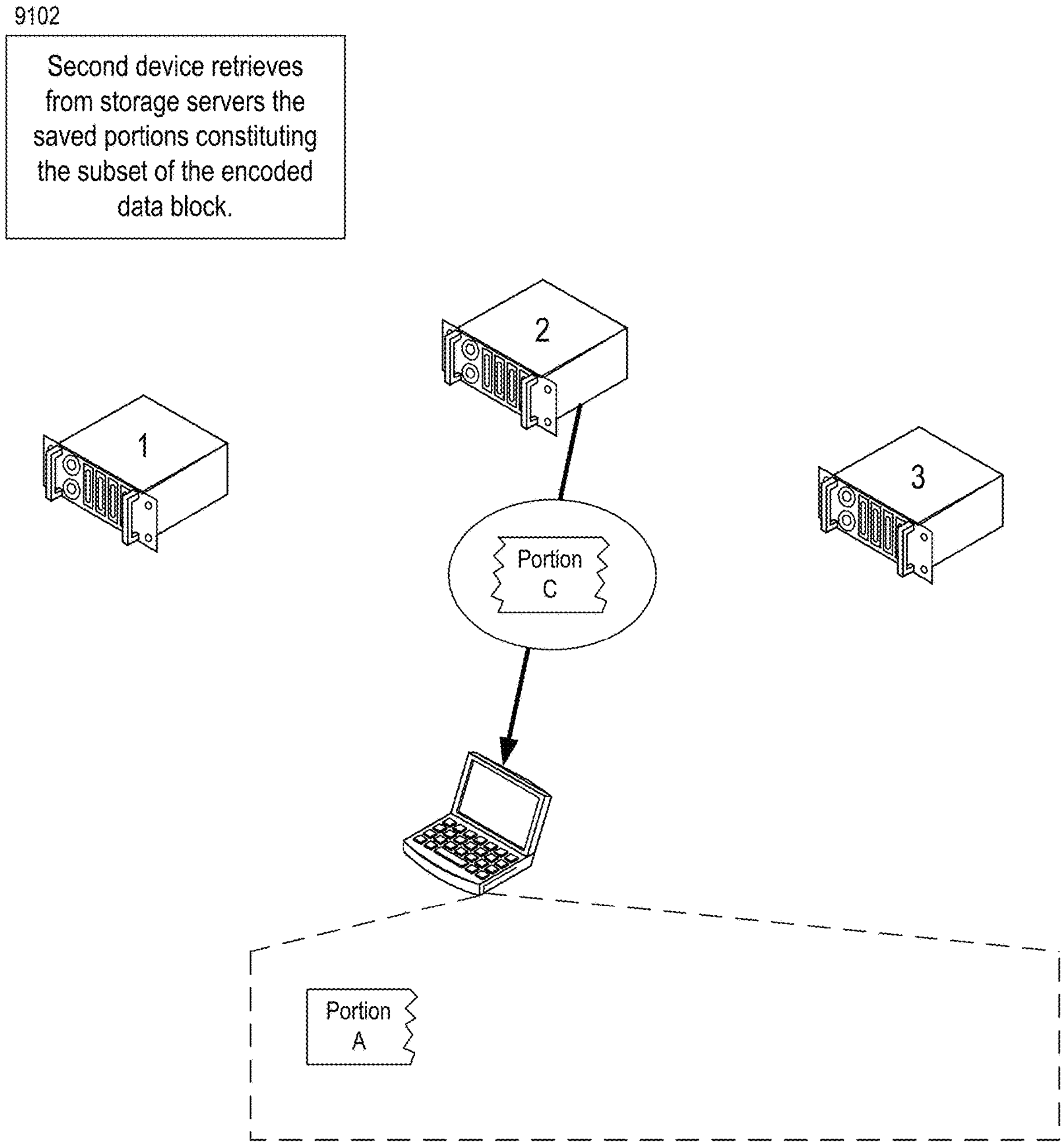
Figure 15:
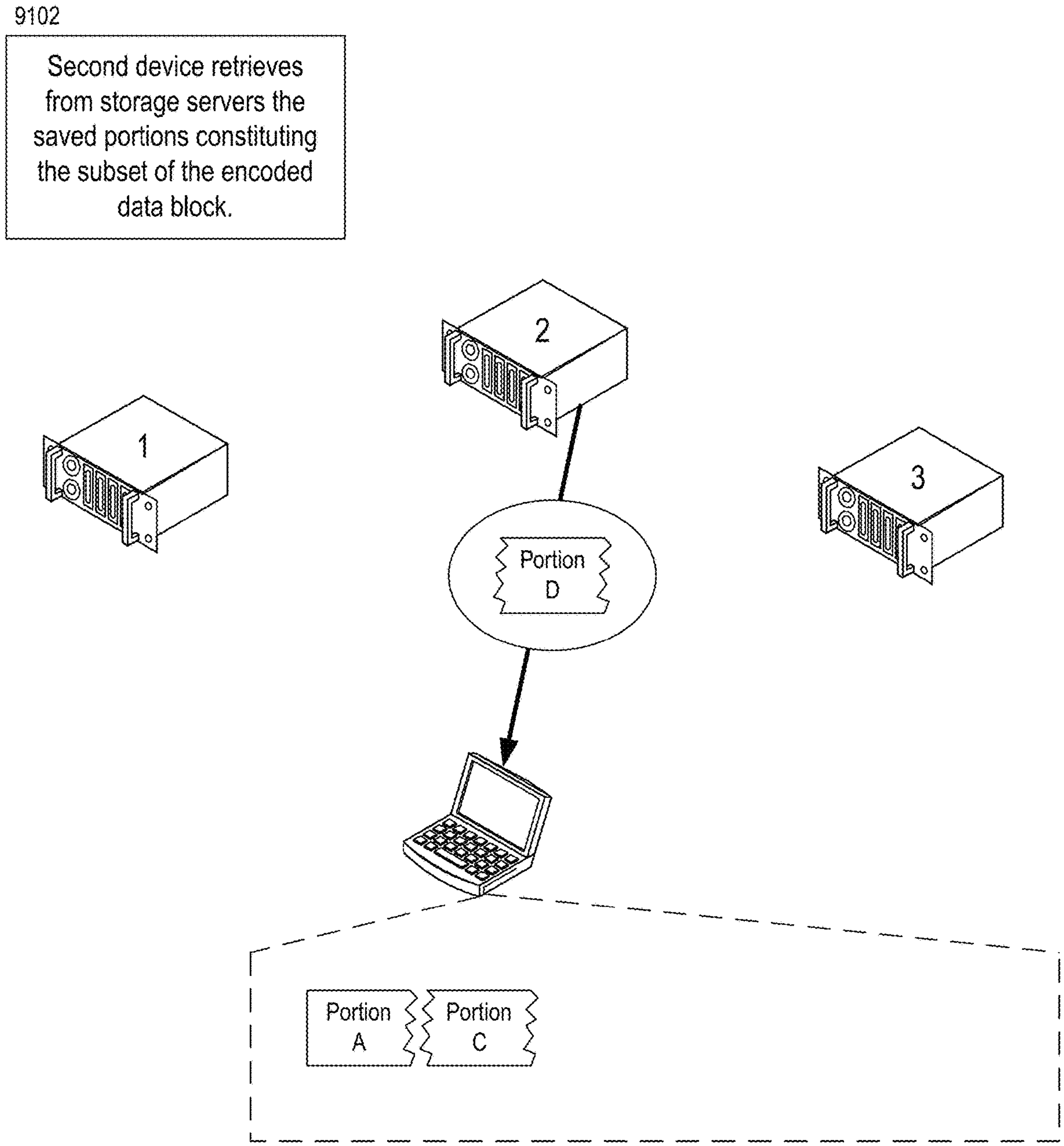
Figure 16:
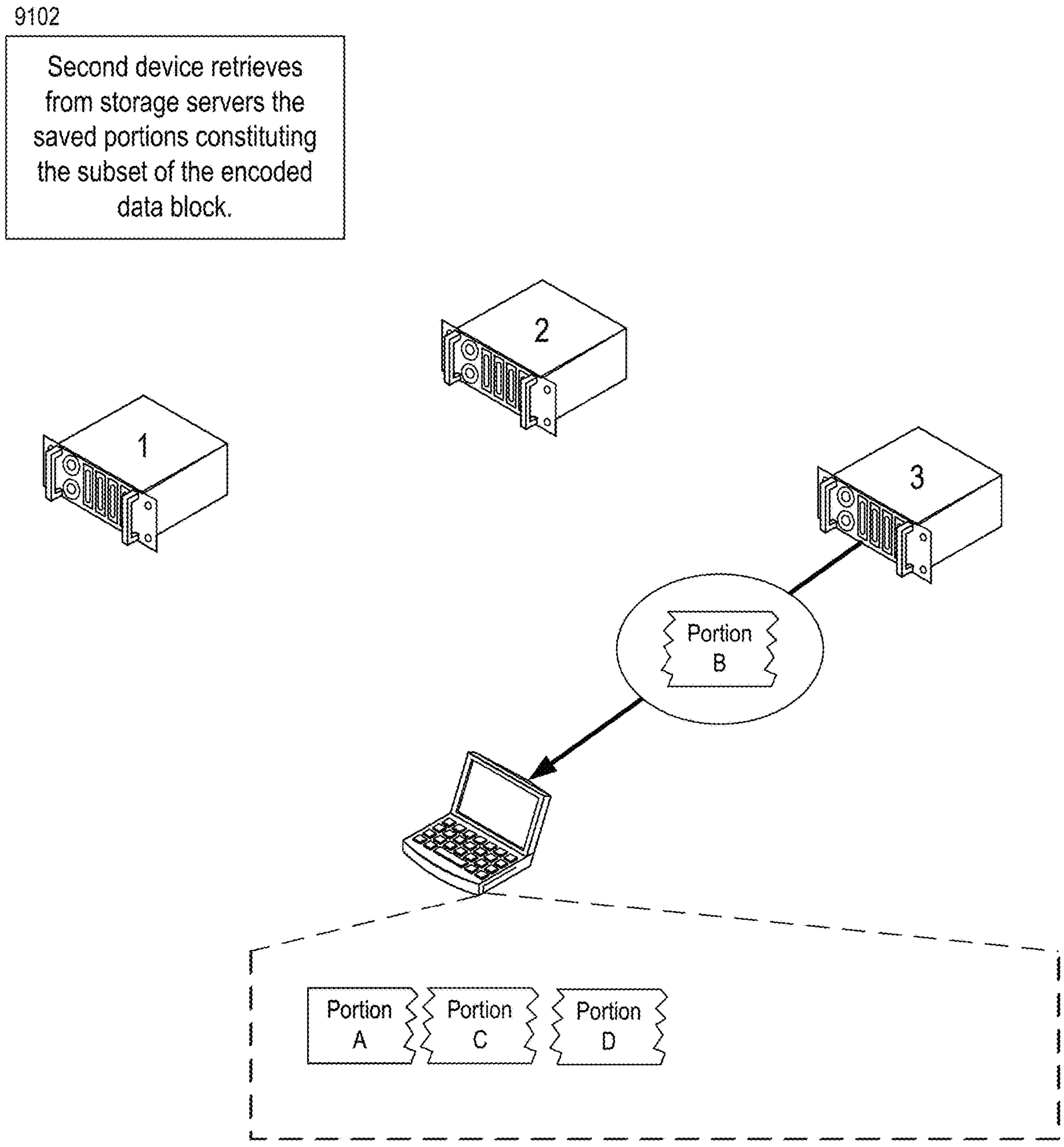
Figure 17:
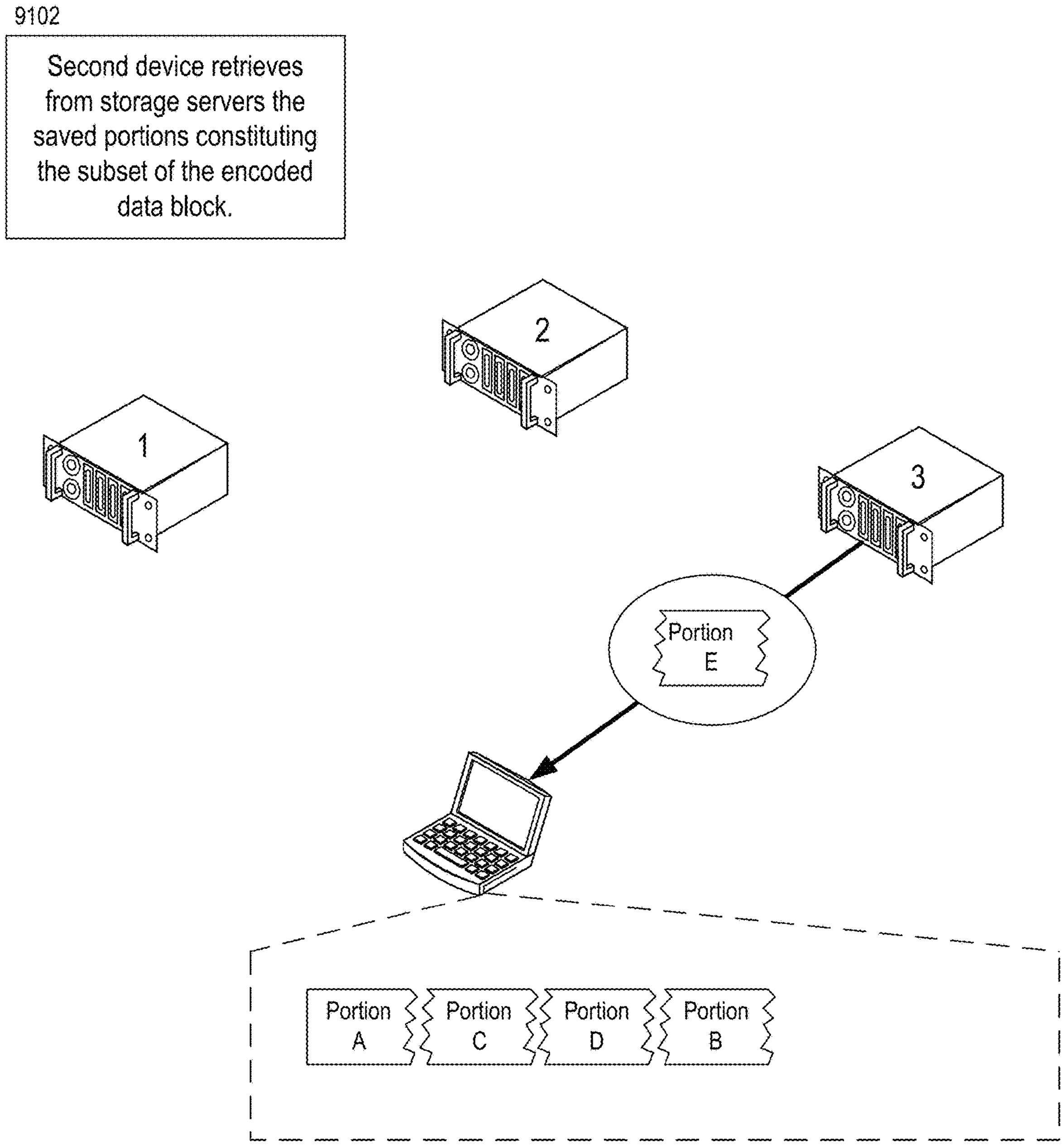

As illustrated in FIG. 13, at step 9102 the second device retrieves from storage servers the portions of the subset of the encoded data block that were saved by the first device. In particular, the second device retrieves portion A from storage server #1, as illustrated in FIG. 13; retrieves portion C from storage server #2, as illustrated in FIG. 14; retrieves portion D from storage server #2, as illustrated in FIG. 15; retrieves portion B from storage server #3, as illustrated in FIG. 16; and retrieves portion E from storage server #3, as illustrated in FIG. 17. The retrievals from the storage servers may be done in series or parallel and each retrieval may be synchronous or asynchronous.

Figure 18:
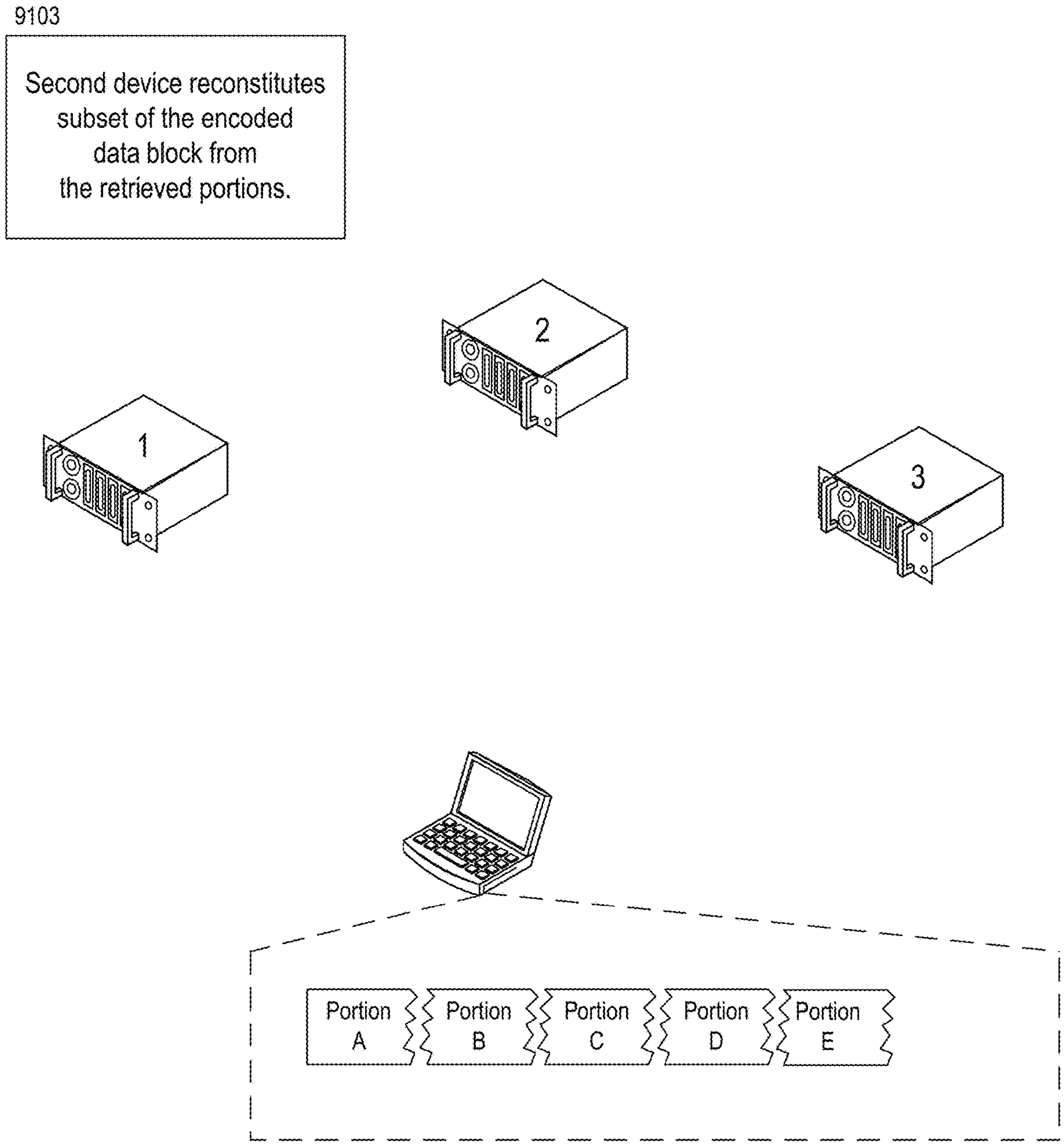
FIG. 18 is a schematic illustration of performance of a step of the method of FIG. 12.

As illustrated in FIG. 18, at step 9103 the second device reconstitutes the subset of the encoded data block from the retrieved portions. Notably, the omitted data schematically not shown because the omitted data is not part of the subset and has not been retrieved by the second device from any of the storage servers.

Figure 19:
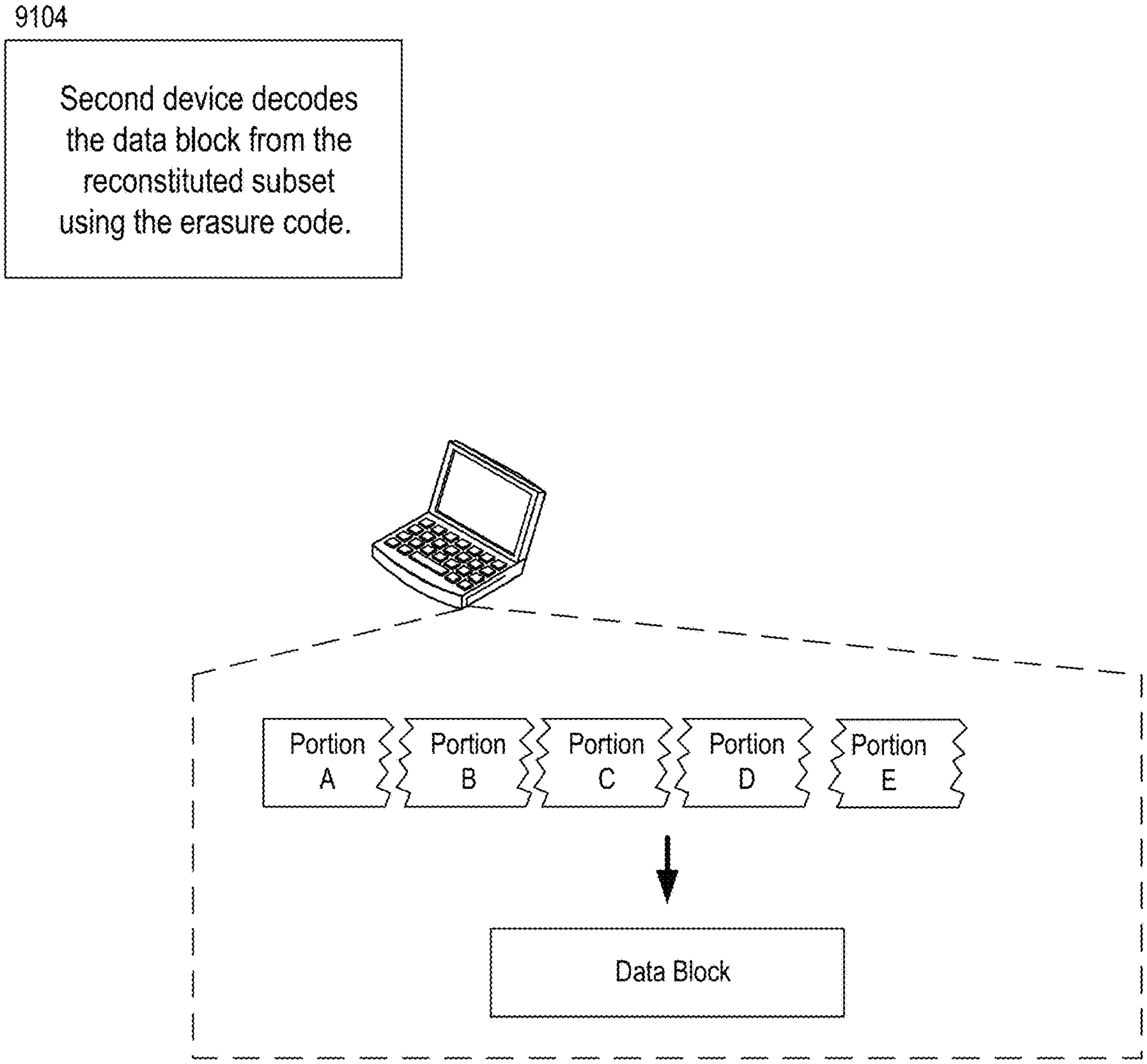
FIG. 19 is a schematic illustration of performance of a step of the method of FIG. 12.

As illustrated in FIG. 19, at step 9104 the second device decodes the reconstituted subset of the encoded data block to obtain the original data block saved by the first device.

The erasure codes used preferably are Bose-Chaudhuri-Hocquenghem (BCH) linear block codes, which form a class of cyclic error-correcting codes that are constructed using polynomials over a finite field. More preferably, erasure codes used preferably are Reed Solomon codes. In coding theory, Reed-Solomon codes are typically identified with the nomenclature RS(n,k), where n is the total number of unique symbols and k is the total number of symbols used in the block. The block size is $2^m-1$, where m is the number of bits used to indicate a symbol. Thus, when using 8-bit or single-byte symbols, the block size is $2^8-1$ which is equal to 255.

Figure 20:
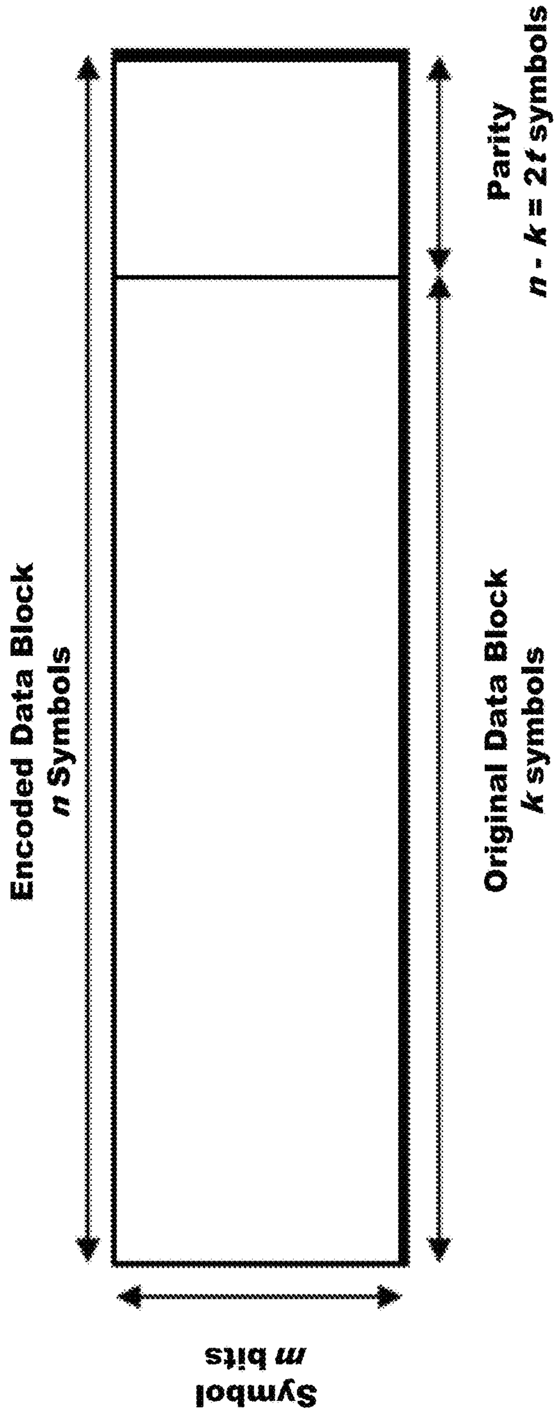
FIG. 20 is a schematic illustration of an encoded data block in general.

A data block encoded with a Reed Solomon code is schematically illustrated in FIG. 20. The encoded data block includes both the data of the data block itself together with parity data. As such, Reed Solomon codes are systematic. As shown in FIG. 20, the encoded data block has n total symbols, of which k symbols are symbols of the original data block and the remaining (n−k) symbols are parity symbols (also sometimes called "parity data" or just "parity"). Each symbol is m bits, with the block having a size of 2,040 bits, which is 255 bytes.

Notably, decoding using Reed-Solomon code can both detect and correct up to t symbols that contain errors, where 2t=(n−k). Moreover, decoding using Reed-Solomon code can detect up to t symbols that contain errors, and can even correct those errors if the byte index positions of the erroneous symbols are known. This is true whether the intentionally altered symbols are message symbols are parity symbols. On the other hand, decoding using Reed-Solomon code does not detect errors when decoding a data block if there are more than t symbols that contain errors.

Sending or saving a subset of an encoded data block is somewhat analogous to sending the encoded data block itself with transmission errors, as the omitted bytes can be filled with random bytes and those bytes deemed errors in the transmission. Thus, if less than t bytes are omitted, then the original data block can be decoded from the subset of the encoded data block. Moreover, if more than t bytes are omitted but no more than 2t bytes, then the errors can be detected and the original data block can even be decoded if the position of the erroneous bytes is known or correctly guessed. Consequently, attempts to obfuscate the data in features and aspects of the invention otherwise might be thwarted if an insufficient number of symbol errors are not injected into the encoded data block. In preferred embodiments, at least t+1 symbols are "erroneous" (i.e., missing or altered), and more preferably 2t+1 symbols are "erroneous" (i.e., missing or altered) such that no errors will be detected and the decoded data block may appear valid.

Accordingly, preferred embodiments of the invention alter at least (2t+1) symbols of the original data block (sometimes referred to herein as message symbols) and, more preferably, alter one bit of each of the (2t+1) message symbols such that the message is obfuscated and no errors in transmission are detected by any hacking device.

In view of the foregoing, preferred methods of the invention will now be described at the block level detail for a greater understanding of aspects and features of the invention. As set forth above, security provided by data obfuscation is desired and is believed to be achieved by one or more such aspects and features.

Figure 21:
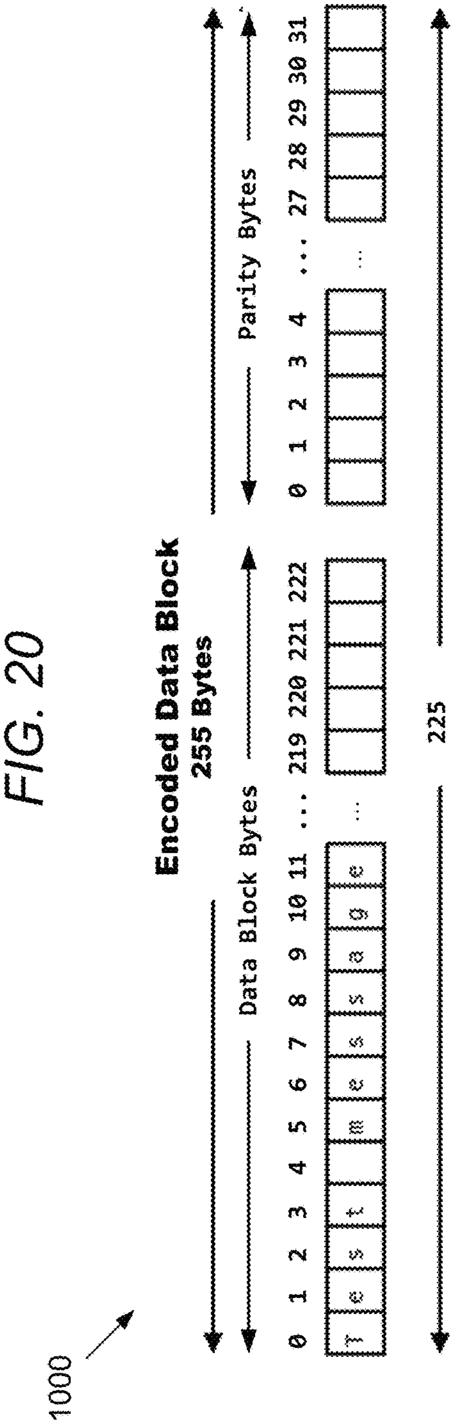
FIG. 21 is schematic illustration of an encoded data block, wherein a data block of 223 bytes has been encoded.

FIG. 21 is schematic illustration of an encoded data block 1000 that results from the encoding of a data block of 223 bytes. The encoded data block 1000 has 223 bytes of the original data block and 32 parity bytes.

FIG. 22 is another schematic illustration of the encoded data block 1000, wherein each byte is represented as a square in the drawing and the squares are represented in a sequential order as indicated by the numbering and arrows (which is shown only for part of the encoded data block for drawing clarity). The gray squares represent bytes of the data block that was encoded and the darker squares with shading represent parity bytes. The encoded data block is shown having a sequence of bytes that are indexed with position numbers 0 through 254. Furthermore, each of the five rows of 51 bytes is indicated by one of the letters A through E, whereby the encoded data block may be divided into five portions each having interleaved data. For ease of reference, this illustration is repeated on each subsequent drawing sheet as FIGS. 26, 30, 34, 38, 42, 46, and 50.

FIG. 23 is schematic illustration of the encoded data block 1000 that has been buffered for communication of portions thereof to different storage locations in a distributed data storage system in accordance with a first preferred method. For comparison, FIG. 24 is schematic illustration of the encoded data block 1000 that has been buffered for communication of portions thereof to different storage locations in a distributed data storage system in accordance with a second preferred method, and FIG. 25 is a table contrasting communications of the portions of the buffered encoded data blocks in accordance with the first and second methods, respectively.

As shown in FIG. 25, each portion corresponds to a row in this example, and each row will be sent to a different storage location in the distributed data storage system. Moreover, each storage location will be identified by an Internet Protocol (IP) address. One or more servers at each storage location preferably serve as storage servers as part of an overlay or software-defined network and/or is part of a storage area network or SAN. Indeed, each location may be a data center located in a different geographical location, such as a different state or region on the United States.

FIG. 27 is the schematic illustration of FIG. 23 upon communication of a first portion of a subset of the encoded data block to a storage location in the distributed data storage system in accordance with the first preferred method. This first preferred method incorporates (t+1) symbol errors through byte omission. As schematically indicated in FIG. 27 and explicitly set forth in the Table of FIG. 29, this portion of the subset has only 47 bytes rather than 51 bytes; bytes at block index locations B10|B70|B160|B235 were not identified as part of the subset and were not sent.

FIG. 28 is the schematic illustration of FIG. 24 upon communication of a first portion of a subset of the encoded data block to a storage location in the distributed data storage system in accordance with the second preferred method. This first preferred method incorporates (2t+1) symbol errors through byte omission. As schematically indicated in FIG. 28 and explicitly set forth in the Table of FIG. 29, this portion of the subset has only 46 bytes rather than 51 bytes; bytes at block index locations B10|B70|B160|B235|B250 were not identified as part of the subset and were not sent.

FIG. 31 is the schematic illustration of the buffered bytes of FIG. 27 upon communication of a second portion of a subset of the encoded data block to a storage location in the distributed data storage system in accordance with the first preferred method. As schematically indicated in FIG. 31 and explicitly set forth in the Table of FIG. 33, this portion of the subset has only 47 bytes rather than 51 bytes; bytes at block index locations B51|B91|B111|B141 were not identified as part of the subset and were not sent.

FIG. 32 is the schematic illustration of the buffered bytes of FIG. 24 upon communication of a second portion of a subset of the encoded data block to a storage location in the distributed data storage system in accordance with the second preferred method. As schematically indicated in FIG. 32 and explicitly set forth in the Table of FIG. 33, this portion of the subset has only 45 bytes rather than 51 bytes; bytes at block index locations B51|B91|B111|B141|B216|B246 were not identified as part of the subset and were not sent.

FIG. 35 is the schematic illustration of the buffered bytes of FIG. 21 upon communication of a third portion of a subset of the encoded data block to a storage location in the distributed data storage system in accordance with the first preferred method. As schematically indicated in FIG. 35 and explicitly set forth in the Table of FIG. 37, this portion of the subset has only 47 bytes rather than 51 bytes; bytes at block index locations B37|B62|B82|B127 were not identified as part of the subset and were not sent.

FIG. 36 is the schematic illustration of the buffered bytes of FIG. 28 upon communication of a third portion of a subset of the encoded data block to a storage location in the distributed data storage system in accordance with the second preferred method. As schematically indicated in FIG. 36 and explicitly set forth in the Table of FIG. 37, this portion of the subset has only 44 bytes rather than 51 bytes; bytes at block index locations B37|B62|B82|B127|B203|B227|B237 were not identified as part of the subset and were not sent.

FIG. 39 is the schematic illustration of the buffered bytes of FIG. 35 upon communication of a fourth portion of a subset of the encoded data block to a storage location in the distributed data storage system in accordance with the first preferred method. As schematically indicated in FIG. 39 and explicitly set forth in the Table of FIG. 41, this portion of the subset has only 47 bytes rather than 51 bytes; bytes at block index locations B68|B78|B108|B143 were not identified as part of the subset and were not sent.

FIG. 40 is the schematic illustration of the buffered bytes of FIG. 36 upon communication of a fourth portion of a subset of the encoded data block to a storage location in the distributed data storage system in accordance with the second preferred method. As schematically indicated in FIG. 40 and explicitly set forth in the Table of FIG. 41, this portion of the subset has only 45 bytes rather than 51 bytes; bytes at block index locations B68|B78|B108|B143|B233|B243 were not identified as part of the subset and were not sent.

FIG. 43 is the schematic illustration of the buffered bytes of FIG. 39 upon communication of a fifth portion of a subset of the encoded data block to a storage location in the distributed data storage system in accordance with the first preferred method. As schematically indicated in FIG. 43 and explicitly set forth in the Table of FIG. 45, this portion of the subset had 51 bytes; all bytes in this portion were identified as part of the subset and were sent.

FIG. 44 is the schematic illustration of the buffered bytes of FIG. 40 upon communication of a fifth portion of a subset of the encoded data block to a storage location in the distributed data storage system in accordance with the second preferred method. As schematically indicated in FIG. 44 and explicitly set forth in the Table of FIG. 45, this portion of the subset has only 43 bytes rather than 51 bytes; bytes at block index locations B14|B24|B34|B44|B54|B64|B79|B94 were not identified as part of the subset and were not sent.

The bytes that were omitted from the communications because they were not identified as being part of the subset can be disregarded; these bytes do not need to be saved in order to decode the original data block from the subset using the erasure code. Accordingly, FIG. 47 shows the buffer having been cleared of the omitted bytes in the first preferred method, with zero bytes remaining in the buffer. Similarly, FIG. 48 shows the buffer having been cleared of the omitted bytes in the second preferred method, with zero bytes remaining in the buffer.

FIG. 49 is the updated table of FIG. 25, reproduced here for ease of reference when considering FIGS. 47-48. The information in the table of FIG. 49 preferably is maintained by the device or elsewhere for later reference when the stored data is accessed, especially when the second preferred method is used having a total number of symbol omissions equal to t (32 bytes in the illustration), whereby the location of the omitted bytes will be known and the original data bock can be readily decoded using the 223 bytes of the subset. In this respect, any bytes can be used as placeholders for the omitted bytes in the decoding process.

While the first and second preferred methods provide a degree of obfuscation of the original data during communication and storage in the distributed data storage system, a greater degree of obfuscation is believed to be desirable. Unfortunately, additional bytes cannot be left out of the subset if the subset is to seemingly represent a block that can be decoded using preferred erasure codes of the present invention. In order to enhance the obfuscation, and in accordance with aspects and features of the invention, the subset is altered by changing at least one bit of a symbol byte, and preferably at least one bit of a data block byte, and knowledge of the alterations made is retained and maintained for later reference when reconstituting the subset for decoding the original data block. This further obfuscation can be incorporated into the above description of the first and second preferred methods, and further be used in network communications. The following description of third and fourth preferred methods of the invention is given in the context of network communications, but is similarly applicable in the context of the above described distributed data storage system.

In particular, FIG. 51 is a schematic illustration of the encoded data block of FIG. 50 after alterations have been made to a plurality of the data block bytes of the encoded data block. Each altered byte is indicated by an exclamation sign "!" as indicated for example at block index B0. Each byte to be omitted by communicating the subset of the encoded data block is indicated by a black square as indicated, for example, at block index B26. Preferably, only bytes of the data block are modified or omitted and none of the parity bytes are modified or omitted for greater obfuscation of the data, although parity bytes could be modified or omitted in lieu of data block bytes.

It will be appreciated that the subset of the encoded data block that is sent (MSG 001) in accordance with the third preferred method is 239 bytes in the illustration of FIG. 51. The 16 bytes that are omitted is shown in the table of FIG. 53. Furthermore, 17 bytes of the subset are altered at byte index positions B1 through B17. The alterations or protocol for making the alterations such that the alterations made can be reversed are retained and maintained, as represented in the table by "A" appearing next to the byte index positions. This knowledge of the alterations made may be kept at the device or may be communicated to a knowledge repository for later reference, such as a central database or a control server in an overlay or software-defined network, or may be communicated to the recipient of the subset that is communicated for decoding of the original data block. In any scenario in which the alteration knowledge is communicated from the first device, such communication is done covertly as disclosed in U.S. patent application Ser. No. 18/091,275, to which the current application claims priority back under 35 U.S.C. 120, and which is incorporated herein by reference in its entirety. Moreover, U.S. Pat. No. 11,924,095 issued Mar. 5, 2024, from U.S. patent application Ser. No. 18/091,275 is hereby incorporated herein by reference. Such covert communication may be done when communicating one or more data packets containing data of the subset or, preferably, is done when communication data packets with payload data that has no relationship to the subset or decoding of the subset for obtaining the original data block.

The subset of the encoded data block that is sent (MSG 002) in accordance with the fourth preferred method is 223 bytes in the illustration of FIG. 52. In this method, the maximum number of bytes of the encoded data block are omitted with one byte of the subset being altered. This reduces the overhead of covertly communicating the knowledge for reversing the alteration made while obfuscating through omission the bytes of the original data block. In this regard, a byte index location and bit location for a single data block byte of the encoded data block need only be covertly communicated, while 32 unaltered bytes of the original data block are omitted when defining the subset to be communicated, rendering 15% of the original data block undiscoverable by a hacker who intercepts the communication of the subset or who gains unauthorized access to the stored subset. The A for B0 in this instance simply becomes the bit position index of the byte at index position "0".

To build on this, the data of a meaningful data block of 223 bytes can be divided into 15 "transport" data blocks and those fifteen data blocks can be communicated in accordance with this fourth preferred embodiment, thereby rendering 100% of the meaningful data block of 223 bytes undiscoverable by a hacker. It is believed that this is true even if the hacker has access to quantum computing capabilities, as the process for decoding the meaningful data block is not simply a matter of a brute force attack, which quantum computers can or likely will be able to successfully perform in real time without noticeable latency or delay. Indeed, it is believed that methods of communication data blocks and storing data blocks is an answer to the securing such data in the age of quantum computers and quantum computing.

It will be appreciated that in accordance with the foregoing, an approach is utilized which allows a portion or fraction of data to be recalculated or reconstructed based on other portions or fractions of the data. An encoding scheme is utilized to encode data, and a code or key can be utilized to calculate missing blocks or fractions of data based on other blocks or fractions of data (e.g., the remainder of the data). Using such an approach to calculate missing or omitted data, rather than communicating or storing the entirety of data, minimizes the risk of interception. To increase entropy, a hash or simple encryption can be used on the data to blur the lines of the blocks or bytes of data to minimize the ability of a hacker to figure out context of information.

Based on the foregoing description, it will be readily understood by those persons skilled in the art that the invention has broad utility and application. Many embodiments and adaptations of the invention other than those specifically described herein, as well as many variations, modifications, and equivalent arrangements, will be apparent from or reasonably suggested by the invention and the foregoing descriptions thereof, without departing from the substance or scope of the invention.

For example, it is contemplated that aspects and feature of the present invention have utility and can be used in the methods, systems, and with the apparatus disclosed in detail in the background section of this application; disclosed in the appendix to the specification, which is incorporated herein by reference; and disclosed in all of the background references incorporated herein. It is further contemplated that aspects and feature of the present invention have utility and can be used with dispersive network technologies disclosed and described herein, and with watermark technologies disclosed and described herein, but that aspects and features of the invention are not limited to use only with one or more such technologies.

It is further contemplated that other forward error correction codes may be used other than Reed Solomon code and that such erasure code has been disclosed for purposes of illustration and not limitation. Other codes that may be used in one or more aspects and features of the invention include turbo codes, tornado codes, low-density parity-check codes, fountain codes, online codes, Luby transform codes, Raptor codes, network codes, parity codes, and maximum distance separable codes.

ADDITIONAL PREFERRED IMPLEMENTATIONS OF ASPECTS AND FEATURES OF THE INVENTION

In accordance with one or more preferred implementations, the distributed data storage system comprises software components that are installed on public/private and hybrid cloud servers and run as drivers or background services on existing edge devices such as laptops, desktops, tablets, and mobile phones. The system preferably creates and controls multiple connections for network sessions as well as defines pathways for data packet communication over networks. System network spread operates at the driver level and runs on most edge device operating systems. Further, because the system client runs as a driver, user applications operate normally. The devices can communicate with other trusted devices, but can also communicate, without disruption, with any resources outside of the system. The movement of packets is driven by two factors, fractional routing, and fractional storage spreads. The fractional routing provides an independent spread of packets across the individual system components while the fractional storage fractionalizes and spreads information in the form of packets across the storage components of the system. Both the fractional routing and fractional storage networking in such preferred implementations leverage the layer 2 (Data Link Layer) and the layer 3 (Network Layer) portions of the OSI layers of the network. By leveraging parts of both layers, the network is able to connect two end points virtually and create a tunnel with characteristics that leverages parallelization to improve network performance, reliability, and control. The variability of the network paths also introduces more entropy into the possible network paths that are used to calculate the digital fingerprint.

Preferably, data packet traffic for a single session is split across the system components to create parallel connections improving the ability to deliver the packets to an edge device. The components leveraged in the communications are the fractional storage servers and fractional engine software. The "fractional engine" software manages the storage split and the routing split. The storage split is the networking between the fractional engine and the fractional storage servers. The routing split is the networking between fractional engines depending upon the need to improve the networking all the way to the end user device.

Software drivers install and reside on the network access layer, between the host's operating system and network interface hardware. Running in these layers, in the OSI stack, enables the fractional routing driver to communicate directly to the network interface hardware so that the fractional routing driver can take control of signaling, routing, and network communications on behalf of the host. The fractional routing driver then helps its system components with other fractional routing-enabled devices to move traffic across managed routes rather than surrendering routing control to non-fractional routing devices, essentially directing the routes.

Packets flow through the fractional routing drivers in response to requests and commands from user-facing applications (e.g., Microsoft Office, mobile device apps, etc.) running at the application layer. An additional advantage the fractional routing driver gains by operating at the bottom of the network stack is that it controls packet traffic at the most efficient point on the host, so there is no perceptible added latency from the perspective of the user or application.

A complex environment to create a digital fingerprint such as a network watermark or enhanced network watermark improves the quality of the security. The alternative indirect paths also enable the system to route around cyber-attacks and network congestion. In accordance with one or more preferred implementations, an approach is utilized involving taking fractional pieces of data and using them for authentication, which reduces processing and eliminates the need to pass encryption keys back and forth. The fractionalized data preferably is buffered (as shown in the drawings) and must be reassembled in the buffer prior to being passed up to the application. This creates a disperse assembly of data that is hard to intercept and modify since the fit back in the buffer forces errors and hacks to the surface. Leveraging error correction and fit of data within the buffer enables corrections keeping the data flowing to the application and stopping disruption of the application performance. Preferably, the system still uses individual corrections per each network flow but also leverages the larger buffered assembly based on fit of data making it very difficult to insert changes or hacks without detection or corruption of data. In accordance with one or more preferred implementations, the fractionalized data is designed to give an unusable amount of data to a hacker or adversary using techniques such as man-in-the-middle. As the buffer is filled, the blocks left open can be calculated rather than sent thereby reducing the amount of data sent as well as leaving out information that the adversary must now calculate to replace. By spreading the data, more options become available for traversing the network by the data to the final destination.

Additionally, as illustrated herein, the fractionalization of the data is achieved by buffering the data and then intentionally leaving data out that is sent so that anyone intercepting the data has incomplete information in recovering the data. Additional techniques for fractionalizing the data include interleaving (shown in the drawings where the portions of the subset comprise non-sequential sequences of bytes), encryption of portions of the data, inverting data, and other ways to further obfuscate and make difficult ways to put the data back together. Furthermore, by sending some pieces of data but "not sending" other pieces of the data as disclosed herein, it very difficult to associate data and creates a non-mathematical puzzle for a hacker to try to put the factionalized data back together.

In accordance with one or more preferred implementations, leveraging networking information with the fractional data enables pathways of packets to be used to create information in authentication that would stop hackers who have hacked into a drive from being able to decipher the authentication mechanism since the networking information would be created when the authentication mechanism is transferred.

Consider a scenario where a first fractional packet (a piece of the data) can be sent directly from a first storage server to a fractional engine that uses the data compiled to create its side of a fractional key. This first fractional packet can also be transmitted through one of the other storage servers and then on to the fractional engine. The first fractional packet can also be split up and sent directly and/or indirectly to the fractional engine through other storage servers operating as deflects or redirects. A fraction of code may also form part of executable code causing access failure if a key is wrong. In accordance with one or more preferred implementations, prior to a connection, a previous history of connection and/or fractional data are used to authenticate the connection. In accordance with one or more preferred implementations, this authentication mechanism can be combined with other authentication mechanisms such as password, biometric, or MAC address. A number of fractions utilized in an implementation may be determined and controlled by storage servers based on an amount of processing available and algorithms for spreading data across storage servers.

Accordingly, while the invention has been described herein in detail in relation to one or more preferred embodiments, it is to be understood that this disclosure is only illustrative and exemplary of the invention and is made merely for the purpose of providing a full and enabling disclosure of the invention. The foregoing disclosure is not intended to be construed to limit the invention or otherwise exclude any such other embodiments, adaptations, variations, modifications or equivalent arrangements, the invention being limited only by the claims appended hereto and the equivalents thereof.

What is claimed is:

1. A method performed at a first networked electronic device for receiving a data block from a second networked electronic device, comprising:

(a) receiving, by the first networked electronic device, from the second networked electronic device:

(i) an altered subset corresponding to a subset of an encoded data block, the encoded data block having been generated by encoding the data block using an erasure code and comprising both parity data and the data block, the subset comprising fewer symbols than the encoded data block, and the altered subset comprising one or more altered symbols corresponding to one or more symbols of the subset; and (ii) alteration information identifying a position, in the encoded data block, of each of the one or more altered symbols and information for reversing an alteration made to each of the one or more altered symbols;

(b) using the alteration information, reversing, by the first networked electronic device, the alterations made to the one or more altered symbols to restore the subset of the encoded data block from which the data block is decodable using the erasure code; and (c) decoding, by the first networked electronic device, the data block from the restored subset using the erasure code.

2. The method of claim 1, wherein the altered subset is received by the first networked electronic device within one or more data packets sent over a network by the second networked electronic device.

3. The method of claim 2, wherein one or more of the data packets are directly sent from the second networked electronic device to the first networked electronic device.

4. The method of claim 2, wherein one or more of the data packets are indirectly sent from the second networked electronic device to the first networked electronic device through one or more intermediate networked electronic devices.

5. The method of claim 2, wherein receiving the alteration information comprises receiving signaling symbols at the first networked electronic device based on network paths by which one or more of the data packets are received by the first networked electronic device from the second networked electronic device.

6. The method of claim 1, wherein said reversing comprises changing a bit of each of a plurality of altered symbols in the altered subset, and wherein each of the plurality of altered symbols corresponds to a data-block symbol rather than a parity symbol.

7. The method of claim 1, wherein a number of symbols absent from the restored subset is equal to or less than a total number of parity symbols of the encoded data block and greater than half of the total number of parity symbols of the encoded data block, and wherein the alteration information further comprises omission information identifying positions of the symbols absent from the restored subset.

8. The method of claim 1, wherein a number of symbols absent from the restored subset is equal to or less than half of a total number of parity symbols of the encoded data block, such that the data block is decodable from the restored subset using the erasure code without knowledge of positions of the symbols absent from the restored subset.

9. The method of claim 1, wherein the erasure code comprises a Reed Solomon code, a linear block Bose-Chaudhuri-Hocquenghem code, or a forward error correction code.

10. The method of claim 1, wherein the encoded data block has a size of 255 bytes and comprises 32 parity bytes, symbols of the encoded data block each consist of 8 bits, and the restored subset has a size of not less than 223 bytes.

11. A first networked electronic device comprising:

one or more network interfaces;

one or more processors; and memory storing instructions that, when executed by the one or more processors, cause the first networked electronic device to:

(a) receive, from a second networked electronic device, an altered subset corresponding to a subset of an encoded data block, the encoded data block having been generated by encoding a data block using an erasure code and comprising both parity data and the data block, the subset comprising fewer symbols than the encoded data block, and the altered subset comprising one or more altered symbols corresponding to one or more symbols of the subset;

(b) receive alteration information identifying a position, in the encoded data block, of each of the one or more altered symbols and information for reversing an alteration made to each of the one or more altered symbols;

(c) use the alteration information to reverse the alterations made to the one or more altered symbols to restore the subset of the encoded data block from which the data block is decodable using the erasure code; and (d) decode the data block from the restored subset using the erasure code.

12. The first networked electronic device of claim 11, wherein the altered subset is received within one or more data packets sent over a network by the second networked electronic device.

13. The first networked electronic device of claim 11, wherein the alteration information identifies a byte-index position in the encoded data block and a bit-position index for a bit to be changed to reverse the alteration.

14. The first networked electronic device of claim 12, wherein the alteration information is received by receiving signaling symbols based on network paths by which one or more of the data packets are received by the first networked electronic device from the second networked electronic device.

15. The first networked electronic device of claim 12, wherein one or more of the data packets are directly sent from the second networked electronic device to the first networked electronic device or are indirectly sent from the second networked electronic device to the first networked electronic device through one or more intermediate networked electronic devices.

16. The first networked electronic device of claim 11, wherein each of the one or more altered symbols corresponds to a data-block byte rather than a parity byte.

17. A non-transitory computer-readable medium storing instructions that, when executed by one or more processors of a first networked electronic device, cause the first networked electronic device to:

(a) receive, from a second networked electronic device, an altered subset corresponding to a subset of an encoded data block, the encoded data block having been generated by encoding a data block using an erasure code and comprising both parity data and the data block, the subset comprising fewer symbols than the encoded data block, and the altered subset comprising one or more altered symbols corresponding to one or more symbols of the subset;

(b) receive alteration information identifying a position, in the encoded data block, of each of the one or more altered symbols and information for reversing an alteration made to each of the one or more altered symbols;

(c) use the alteration information to reverse the alterations made to the one or more altered symbols to restore the subset of the encoded data block from which the data block is decodable using the erasure code; and (d) decode the data block from the restored subset using the erasure code.

18. The non-transitory computer-readable medium of claim 17, wherein the altered subset is received within one or more data packets sent directly from the second networked electronic device to the first networked electronic device or indirectly from the second networked electronic device to the first networked electronic device through one or more intermediate networked electronic devices.

19. The non-transitory computer-readable medium of claim 17, wherein the alteration information is received by receiving signaling symbols based on network paths by which one or more data packets comprising the altered subset are received by the first networked electronic device.

20. The non-transitory computer-readable medium of claim 17, wherein the erasure code comprises a Reed Solomon code, the encoded data block has a size of 255 bytes and comprises 32 parity bytes, and the restored subset has a size of not less than 223 bytes.

* * * * *